United States Patent
Hirosawa et al.

[11] Patent Number: 5,995,729
[45] Date of Patent: Nov. 30, 1999

[54] METHOD AND APPARATUS FOR AIDING CONFIGURATING MANAGEMENT OF A COMPUTER SYSTEM

[75] Inventors: Toshio Hirosawa, Machida; Tsutomu Ito, Tsukui-gun; Motohide Kokunishi; Atsushi Ueoka, both of Hachioji; Seiji Inoue, Hadano; Yoshio Ukai, Yokohama, all of Japan

[73] Assignee: Hitachi, Ltd., Tokyo, Japan

[21] Appl. No.: 09/074,316

[22] Filed: May 8, 1998

Related U.S. Application Data

[63] Continuation-in-part of application No. 08/504,665, Jul. 20, 1995, Pat. No. 5,751,575.

[30] Foreign Application Priority Data

Jul. 22, 1994 [JP] Japan ................................ 6-171153

[51] Int. Cl.$^6$ .................................................. G06F 9/455
[52] U.S. Cl. .............................. 395/500.01; 345/500.27
[58] Field of Search .......................... 395/500.01, 123, 395/500.27; 379/29; 434/428; 364/188

[56] References Cited

U.S. PATENT DOCUMENTS

| | | | |
|---|---|---|---|
| 4,446,341 | 5/1984 | Rubin | 379/29 |
| 4,512,747 | 4/1985 | Hitchens et al. | 434/428 |
| 4,604,718 | 8/1986 | Norman et al. | 395/500.27 |
| 4,970,666 | 11/1990 | Welsh et al. | 345/423 |
| 5,751,575 | 5/1998 | Hirosawa et al. | 364/188 |

FOREIGN PATENT DOCUMENTS 96-036592 2/1996 Japan ........................... G06F 17/50

*Primary Examiner*—Kevin J. Teska
*Assistant Examiner*—Dan Fiul
*Attorney, Agent, or Firm*—Antonelli, Terry, Stout & Kraus, LLP

[57] ABSTRACT

In response to a variety of commands entered via a terminal unit, a configuration-management aiding apparatus directly connected to a computer system carries out various kinds of work such as laying-out of pieces of equipment, inspection of the layout of the pieces of equipment for an overlap, inspection of amounts of dissipated heat, inspection of amounts of consumed electrical power, inspection of connection of cables, creation of a cabling work specification manual, creation of a logical-configuration drawing and creation of configuration defining parameters. The configuration defining parameters are transferred to a file in the computer system. The terminal unit of the configuration-management aiding apparatus also functions as a console of the computer system.

59 Claims, 20 Drawing Sheets

FIG. 2

|   | COMMAND NAME | FUNCTION | REMARK |
|---|---|---|---|
| 1 | SET-DEV | EQUIPMENT LAYOUT | |
| 2 | CHK-AC | CALCULATION AND INSPECTION OF AMOUNTS OF DISSIPATED HEAT | |
| 3 | CHK-PWR | CALCULATION AND INSPECTION OF AMOUNTS OF CONSUMED ELECTRICAL POWER | |
| 4 | SET-CBL | CONNECTION OF CHANNEL CABLES | |
| 5 | SET-PCBL | CONNECTION OF POWER-SUPPLY CABLES | |
| 6 | GEN-TBL | CREATION OF A WORK SPECIFICATION MANUAL | FILE, LIST OUTPUT |
| 7 | GEN-CNF | CREATION OF A LOGICAL-CONFIGURATION DRAWING AND CONFIGRATION DEFINING PARAMETERS | |
| 8 | EDT | FILE-CONTENT EDITING | |
| 9 | TRS | TRANSFERRING OF CONFIGURATION DEFINING PARAMETERS TO A COMPUTER SYSTEM | |

FIG. 10

| FLOOR | CAPACITY (KW) | DEVICE | USAGE | TOTAL |
|---|---|---|---|---|
| FL1 * | 400 | CPU1 | 70 | 480 |
| | | DISC1 | 90 | |
| | | DISC2 | 80 | |
| | | MT1 | 40 | |
| | | . | | |
| | | . | | |
| | | FD1 | 3 | |
| | | LP1 | 10 | |
| FL2 | 200 | CPU2 | 55 | 135 |
| | | DISC4 | 80 | |

| FLOOR | POWER CAP. (A) | | | TOTAL USAGE (A) | |
|---|---|---|---|---|---|
| | 200V | 100V | | 200V | 100V |
| * FL1 | 1300 | 200 | CPU1 | 1800 | 30 |
| | | | DISC1 | 350 | |
| | | | DISC2 | 450 | |
| | | | MT1 | 400 | |
| | | | . | 200 | |
| | | | . | | |
| | | | FD1 | 50 | 30 |
| | | | LP1 | | |
| FL2 | 1000 | 100 | CPU2 | 675 | 0 |
| | | | DISC4 | 275 | |
| | | | | 400 | |

POWER-SUPPLY CONTROL BLOCK (BK-T)
54

| BREAKER NAME | CONNECTED-EQUIPMENT NAME |
|---|---|
| POWER-SUPPLY VOLTAGE | BREAKING CURRENT |
| POWER-SUPPLY CABLE LENGTH ||
|  |  |
|  |  |
|  ||
|  ||

FIG. 15

55 CHANNEL-CABLING INSTRUCTION TABLE (CH-CBL)

| # | NAME | SLOT | FROM | TO | LENGTH | TYPE |
|---|---|---|---|---|---|---|
| 1 | CPU1 | 0 | CH0 | CD1 | 10 | METAL |
| 2 | | 1 | CH1 | DKC1 | 20 | OPTICAL |
| 3 | | 2 | | | | |
| 4 | | 3 | | | | |
| ⋮ | | | | | | |
| 10 | | | CD1 | CD2 | 3 | METAL |
| 11 | | | DKC1 | DKC2 | 5 | OPTICAL |
| | | | | | | |

FIG. 16

56 POWER-SUPPLY CABLING INSTRUCTION TABLE (P-CBL)

| # | NAME | BREAKER | V | A | TO | LENGTH |
|---|---|---|---|---|---|---|
| 1 | PW-CTL | BK1 | 200 | 30 | DKC1 | 40 |
| | | BK2 | 200 | 400 | CPU1 | 50 |
| | | | | | | |
| | | | | | | |
| | | | | | | |
| 2 | PW-M | CBK1 | 100 | 5 | TERM1 | 30 |
| | | CBK2 | 200 | 50 | LP1 | 40 |
| | | | | | | |

FIG. 19

| | | | |
|---|---|---|---|
| 66 — | CH0 | CHANNEL | PATHID=00, TYPE=MPX |
| 67 — | CH1 | CHANNEL | PATHID=01, TYPE=BLMPX |
| 68 — | CH2 | CHANNEL | PATHID=02, TYPE=BLMPX |

⋮

| | | | |
|---|---|---|---|
| 69 — | CH0CU | CONTRLR | CUNO=001, DEVA=(08,1), PATHID=00, TYPE=NS |
| 70 — | CH1CU1 | CONTRLR | CUNO=010, DEVA=(11,3), PATHID=01, TYPE=S |
| 71 — | CH1CU2 | CONTRLR | CUNO=020, DEVA=(21,3), PATHID=01, TYPE=S |
| 72 — | CNS | IODEVICE | ADDRESS=008, CUNO=001, DEVA=08 |
| 73 — | DK1 | IODEVICE | ADDRESS=(111,3), UNIT=6586, CUNO=010, DEVA=11, FEATURE=(SHARED) |
| 74 — | DK2 | IODEVICE | ADDRESS=(121,3), UNIT=6586, CUNO=020, DEVA=21, FEATURE=(SHARED) |

METHOD AND APPARATUS FOR AIDING CONFIGURATING MANAGEMENT OF A COMPUTER SYSTEM

This application is a continuation-in-part application of application Ser. No. 08/504,665 filed on Jul. 20, 1995 (now U.S. Pat. No. 5,751,575).

BACKGROUND OF THE INVENTION (1) Field of the Invention

The present invention relates to a method and system for aiding configuration management of a computer system, wherein designing the physical layout typically involves processing units, input/output units and other pieces of equipment composing the computer system and the management also generally involves generation of configuration parameters required for an operating system of the computer system.

(2) Description of the Related Art

When installing a new computer system comprising a set of central processing units, a set of input/output units and a set of other pieces of equipment, or when it is necessary to add new equipment to or to move some equipment from an existing computer system, the following jobs need to be done.

(1) Determine a layout within an installation site.
(2) Check whether the capacities of the power supplies in the installation site are sufficient or insufficient.
(3) Check whether or not the cooling capacity of the air-conditioner in the installation site is sufficient or insufficient.
(4) Prepare a manual of how to connect cables of power supplies for each piece of equipment and carry out the cabling work.
(5) Prepare a manual of how to connect signal cables among pieces of equipment and carry out the cabling work.
(6) Determine configuration parameters required by the OS (operating system) and generate a system based on the configuration parameters.

The jobs described above are part of the work to manage the operation of the computer system and, in particular, pertain to the category of non-steady operation jobs. Normally, these jobs are the responsibility of a specialist known as a system engineer. In a large-scale batch center or on-line center, the number of pieces of equipment composing a computer system is several hundreds to several thousands and there are normally five to six resident system engineers assigned to a computer-system site.

When it is necessary to install a new computer system or to move the installation of some equipment from an already existing computer system, first of all, the system engineer in charge of the jobs determines installation locations of the equipment by trial and error using scaled-down drawings of the installation locations and the equipment prior to the creation of an equipment-layout drawing. The system engineer then checks whether the capacities of the power supplies and the cooling capacities of the air-conditioners at the installation site are sufficient or insufficient. In recent years, these jobs can be carried out by using tabular-calculation software.

In order for the people in charge of the jobs to be able to perform the connection work to connect cables between power supplies and equipment and signal cables among pieces of equipment, manuals describing connection instructions for the power-supply and signal cables must be prepared. These connection-specification manuals include equipment-layout drawings showing lines additionally drawn thereon for denoting power-supply and signal cables. Furthermore, in order to make it easy to install the equipment, manuals describing instructions for these kinds of work must also be prepared. These work-specification manuals describe instructions regarding the installation locations of the equipment, connections among pieces of equipment, the type and length of each cable and units to which cables are to be connected.

While these jobs are being done, preparation for completing the OS is needed. The preparation to complete the OS is known as system generation comprising the following processes:

(1) A process to reflect the device configuration of the computer system in the OS.
(2) A process to define optional functions of the OS and include processing programs for the optional functions in the OS.

In particular, the process (1) is referred to as I/O generation (I/O GEN) whereas the processes (1) and (2) are called the system generation (SYSGEN), a generic name for both the processes.

In the I/O generation, attributes of all pieces of equipment composing the computer system and connection/relation among the pieces of equipment need to be described clearly. For this reason, in the system generation, descriptions of parameters for defining the system configuration are created and then entered into the computer system. At the same time, drawings showing the configuration of the connection among the pieces of equipment (known as logical-connection drawings) need to be created, maintained and controlled. Theses jobs were mostly done manually in the past.

SUMMARY OF THE INVENTION

As described above, in the past, creation of an equipment layout, determination of cable connection, creation of drawings showing the cable connection, checking the capacities of power supplies and the air-conditioners and creation of logical-connection drawings to mention a few are done individually by people in charge of the jobs. The created manuals are also controlled individually by people in charge of the jobs. On top of that, only some of these jobs are done by utilizing computer software such as a tabular-calculation program while the remaining majority relies on human power.

As a result, problems listed below are encountered.
(1) Miscommunication is likely to occur at every phase of the jobs.
(2) Detailed information on details of equipment characteristics such as types of connectable cables is limited to knowledge levels of individual people in charge of the jobs.
(3) A dedicated system engineer is required for each work unit or at each customer site.

If the above problems can be solved, big improvement of non-steady jobs to build up a computer system can be expected.

It is therefore an object of the present invention to aid, by means of a computer, various kinds of intellectual work required in installing a new computer system or partially modifying the existing computer system.

More specifically, it is an object of the present invention to automatically inspect a variety of conditions required in the determination of an equipment layout and cable connection.

It is another object of the present invention to enable the determination of an equipment layout and cable connection through an interactive process between a computer and the user.

It is further another object of the present invention to aid a variety of intellectual work required in the installation and modification of a computer system by means of a single computer serving as a uniform tool for all kinds of the intellectual work.

It is still further another object of the present invention to automatically create a variety of manuals required as aids in the determination of a layout and cable connection of pieces of equipment.

It is still further another object of the present invention to provide an aid computer for computing parameters for defining a system configuration and to allow a computer system installed in accordance with specifications determined by the support of the aid computer to directly utilize the parameters without human intervention.

It is still further another object of the present invention to allow the aid computer to be used as a console of a computer system installed in accordance with specifications defined through the support of the aid computer.

In order to achieve the objects described above, a method for a configuration management according to the present invention comprises the following steps:

determining proper locations for installing pieces of equipment composing a computer system through use of a drawing of an installation area displayed in a display screen and interactive operations between a user and the computer system;

inspecting cables connecting the pieces of equipment after their installation locations have been determined for connection appropriateness, in response to a command issued by the user; and generating configuration defining parameters to be used by the operating system of the computer system from characteristics of the pieces of equipment after the cable connection has passed inspection.

In the process of determining the locations for installing the pieces of equipment, the computer performs the following:

displaying a drawing of an installation area, displaying figures of pieces of equipment specified by the user on an installation area on the drawing specified by the user, or moving the figure of a piece of equipment specified to be moved to another location, and checking whether or not the moved figure overlaps figures of existing pieces of equipment at other locations. The movement of equipment from an installation area to another one is accomplished by using a multi-window function. A piece of equipment overlapping another one is displayed, when such an overlap is detected. When the layout of the pieces of equipment has been determined, an apparatus attribute values table including characteristics of the pieces of equipment and an environment attribute values table including characteristics of installation areas are created.

For each installation area, the total amount of heat dissipated by the pieces of equipment is compared to the cooling capacity of the air-conditioner. If the former is found greater than the latter, a warning is displayed. In addition, the total amount of electric power consumed by the pieces of equipment is compared to the capacities of the power supplies. If the former is found greater than the latter, a warning is similarly displayed.

For pieces of equipment having their installation locations determined, channel cables and power-supply cables connecting pieces of equipment specified by the user on a display screen are displayed. As for the connection of the channel cables, the connection appropriateness is examined. Any detected improper connection is displayed. For example, the number of daisy-chained units (the number of pieces of equipment in a daisy-chain connection) is checked against the length of the cable.

After the installation locations and connection of the pieces of equipment have been determined, a logical-configuration drawing expressing logical interconnection among the pieces of equipment and configuration defining parameters for use by a system-generation program are created by using information obtained from the processes carried out so far. In addition, a manual describing work instructions for the installation work can also be created as well. The configuration defining parameters are, in some cases, transferred directly to the computer system, an object of the configuration management. Furthermore, the system-generation program of the computer system can also be invoked directly from a terminal unit of the aid computer.

In addition, according to the present invention, the aid computer and the computer serving as an object of the configuration management (referred to hereafter as a configuration-management-object computer) are connected to each other by connection equipment for transferring the configuration defining parameters, forming a compound computer. It should be noted, however, that the connection between the computers can also be implemented by a LAN (Local Area Network) as well. In addition, the connection equipment can be designed so as to also allow a command to activate the system-generation program to be transmitted from the terminal unit of the aid computer to the configuration-management-object computer. Furthermore, other commands can also be transmitted from the terminal unit to the computer serving as an object of the configuration management. On top of that, messages can be output by the configuration-management-object computer to the terminal unit. In general, the aid computer can also carry out functions of a console of the configuration-management-object computer.

According to the method provided by the present invention as described above, various kinds of intellectual work required in the installation of a new computer system or partial modification of an existing computer system can be supported by using an aid computer. More specifically, a variety of conditions required in the determination of a layout and cable connection of pieces of equipment are inspected automatically. In other words, a layout and cable connection of pieces of equipment are determined through an interactive process between the aid computer and the user. In addition, various kinds of intellectual work required in the installation or modification of a computer system is supported by a single aid computer in a uniform manner. On top of that, a variety of manuals required as aids to the determination of a layout and cable connection of pieces of equipment are generated automatically.

In addition, by virtue of the compound computer provided by the present invention, configuration defining parameters generated by the aid computer can be used directly by the computer system installed in accordance with specifications determined by the support provided by the aid computer without human intervention. In other words, the aid computer can serve as a console of the computer system installed in accordance with specifications determined by the support provided by the aid computer.

BRIEF DESCRIPTION OF THE DRAWINGS

FIG. 2 is a drawing showing a typical command set used in the present invention;

FIG. 10 is a drawing of a typical display screen showing a table of the amount of dissipated heat and the cooling capacity of the air-conditioner for each floor;

FIG. 11 is a drawing of a typical display screen showing a table of the amount of consumed electric power heat and the capacities of power supplies for each floor;

FIG. 13 is a drawing showing a set of typical power-supply control blocks for power-supply cables connected to the pieces of equipment;

FIG. 15 is a drawing showing a typical channel-cabling instruction table;

FIG. 16 is a drawing showing a typical power-supply-cabling instruction table;

FIG. 19 shows more concrete examples of the configuration defining parameters.

DESCRIPTION OF THE PREFERRED EMBODIMENTS

Figure 1:
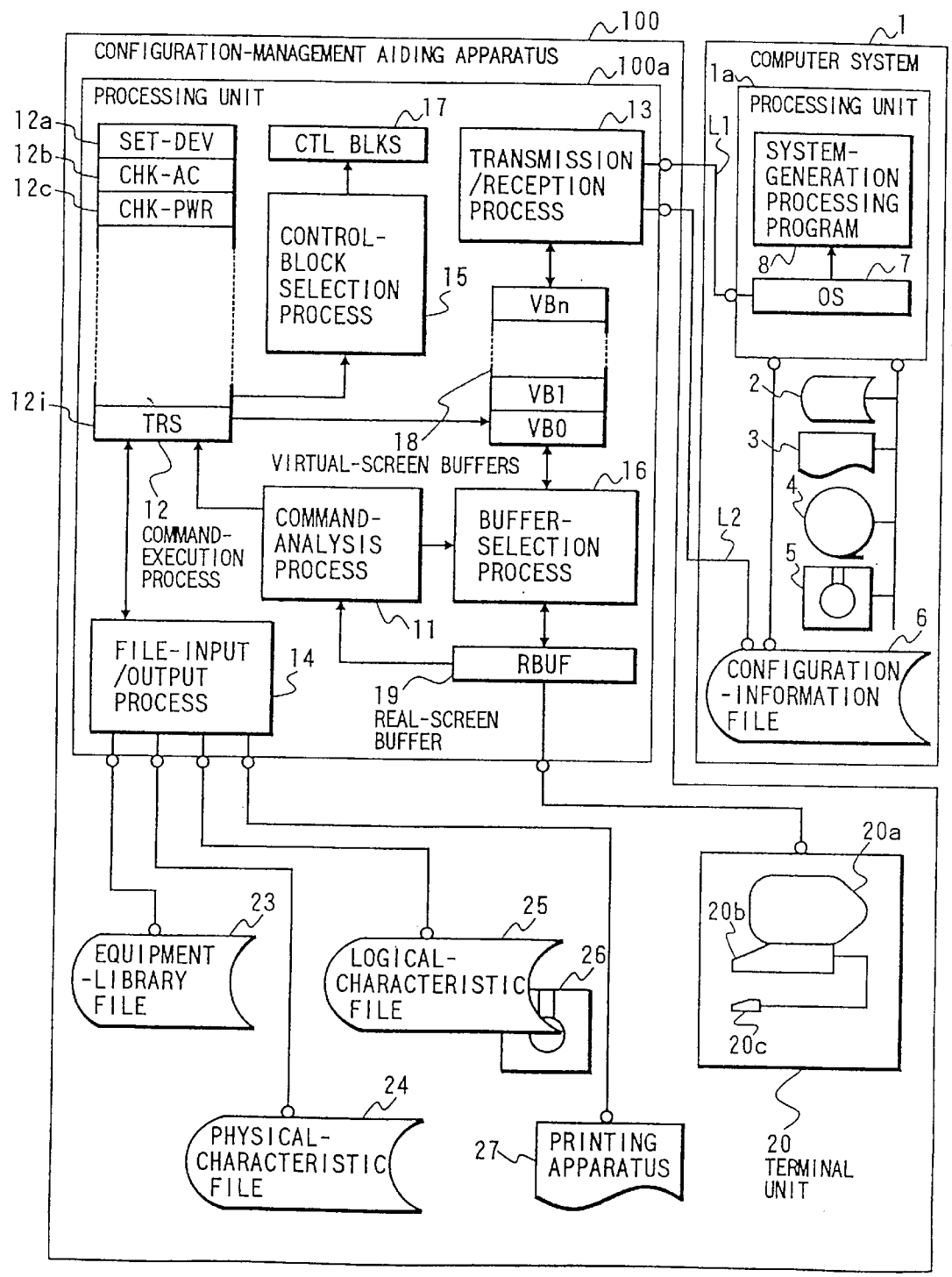
FIG. 1 is a block drawing of an embodiment provided by the present invention.

FIG. 1 shows, in a simple way, characteristics of a method for aiding configuration management of a computer system and an apparatus provided by the present invention.

A block 1 shown in the figure is a computer system whereas a block 100 is a configuration-management aiding apparatus provided by the present invention. The computer system 1 comprises a processing unit 1a which includes a CPU and a main storage device, magnetic-disc drives 2 and 6 connected to the processing unit 1a, a line-printer unit 3, a magnetic-tape drive 4 and a set of input/output units including a floppy-disc drive 5. In particular, the magnetic-disc drive 6 is used as a configuration-information file. An OS 7 runs on the processing unit 1a whereas a system-generation processing program 8 runs under the operating system 7.

The configuration-management aiding apparatus 100 itself is a computer system which comprises a processing unit 100a including a CPU (not shown) and a main storage device (not shown), a terminal unit 20 connected to the processing unit 100a, magnetic-disc drives 23 to 25, a floppy-disc drive 26 and a printing apparatus 27. The terminal unit 20 comprises a display unit 20a, a keyboard 20b and a mouse 20c.

In particular, the magnetic-disc drive 23 is used as an equipment-library file for storing, among other pieces of information, characteristics, dimensions and shapes of a variety of equipment. The magnetic-disc drive 24 is, on the other hand, used as a physical-characteristic file for storing, among other pieces of information, the shape and dimensions of each floor, the layout of pieces of equipment and the physical connection among the pieces of equipment. The magnetic-disc drive 25 is, by the way, used as a logical-characteristic file for storing, among other pieces of data, logical connection/relation among the pieces of equipment and configuration defining parameters.

In this embodiment, these files are deliberately stored in separate magnetic-disc drives in order to make the explanation simple. It should be noted, however, that these files can also be stored in a single magnetic-disc drive. The floppy-disc drive 26 is used for outputting created configuration defining parameters to a floppy disc whenever necessary.

On the other hand, the processing unit 100a comprises a command-analysis process 11, a command-execution process 12, a transmission/reception process 13, a file-input/output process 14, a control-table-selection process 15, a buffer-selection process 16, control block 17, a set of virtual-screen buffers (VB0 to VBn) 18 and a real-screen buffer (RBUF) 19. The command-execution process 12 comprises command-execution processing sub-programs 12a to 12i for executing a plurality of commands as will be described later.

In this embodiment, the processes 11 to 16 are each implemented as a program module whereas the control blocks 17, the virtual-screen buffers (VB0 to VBn) 18 and the real screen buffer (RBUF) 19 are areas allocated to them in a main storage device of the computer system (not shown).

A command to the configuration-management aiding apparatus 100 is entered by operating keys on the keyboard 20b or by selecting a command from a command menu displayed on the screen of the display unit 20a by means of a mouse 20c. A command entered in this way is passed on to the command-analysis process 11 through the real-screen buffer 19. The command-analysis process 11 interprets the command, selecting one of the command-execution processing sub-programs 12a to 12i associated with the command. The selected sub-program is then invoked.

The configuration-management aiding apparatus 100 can be a computer system of any size as long as it has a sufficient storage capacity for accommodating the processing programs and sub-programs, the control blocks, the virtual-screen buffers and the real-screen buffer and the peripheral units described above or their equivalents. For example, a personal computer can be used as the configuration-management aiding apparatus 100.

In the embodiment shown in the figure, the configuration-management aiding apparatus 100 is connected to the computer system 1, an object of the configuration management, by cables L1 and L2.

To be more specific, the configuration-management aiding apparatus 100 can communicate with the OS 7 running on the computer system 1 through the cable L1 and can access the configuration-information file 6 of the computer system 1 through the cable L2. Only after the installation of the computer system 1, an object of the configuration management, has been completed can such communication take place or such an access be made. When it is necessary to add a new piece of equipment to an already installed computer system 1 or to move an existing piece of equipment employed by the computer system 1 to another place after the installation has been completed, configuration defining parameters created by the configuration-management aiding apparatus 100 as will be described later can be directly transferred from the configuration-management aiding apparatus 100 to the configuration-information file 6 of the computer system 1 through the cable L2.

When a new computer system 1 is to be installed, however, the connection by the cables L1 and L2 does not exist yet. In this case, configuration defining parameters are output by the floppy-disc drive 26 to a floppy disc which can later be mounted on the floppy-disc drive 5 employed in the computer system 1.

Figure 3:
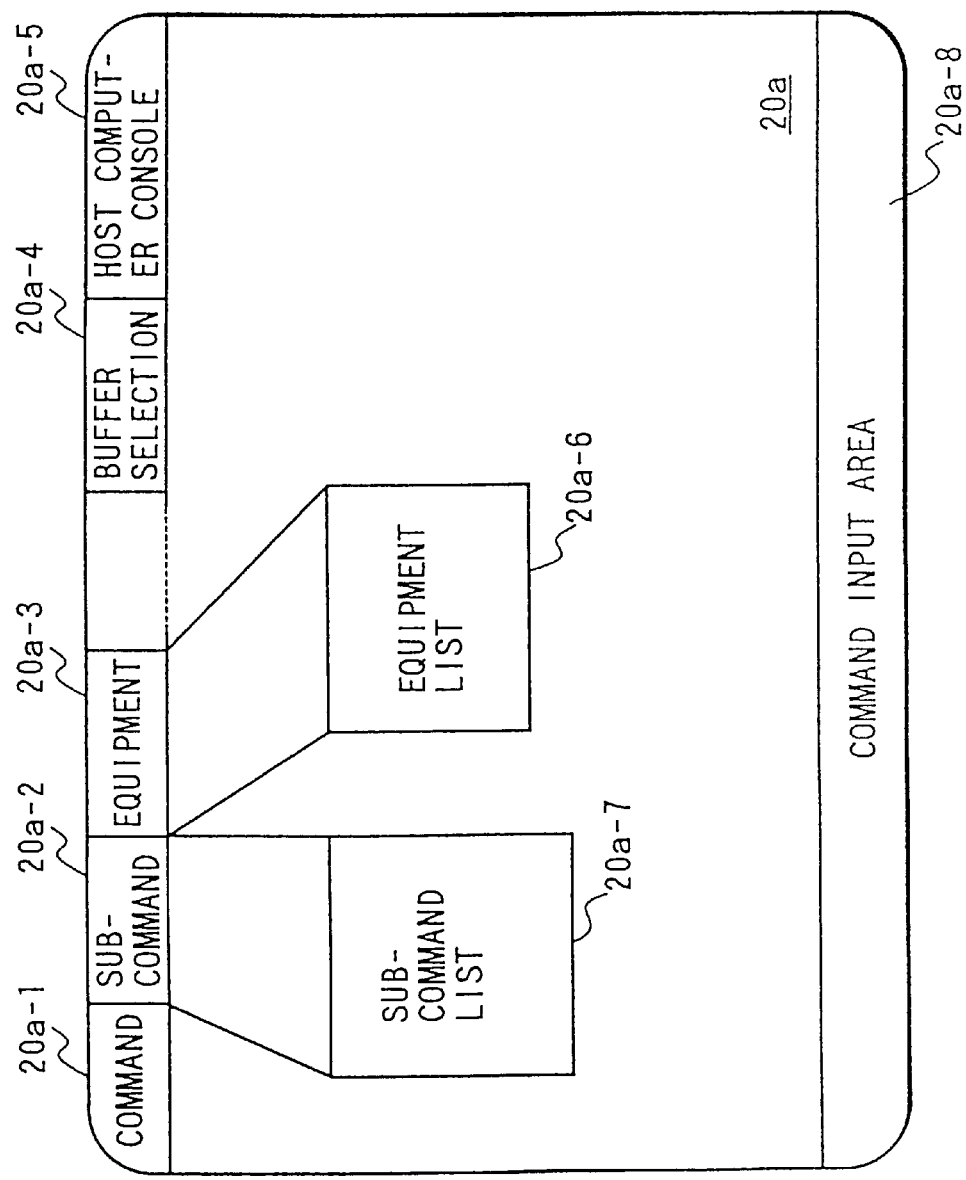
FIG. 3 is a drawing showing a typical selection-menu screen.

FIG. 2 shows a table of commands that can be executed by the command-execution process 12. FIG. 3 shows a typical command menu appearing on the screen of the display unit 20a.

As shown in FIG. 3, the command menu on the screen comprises a command specifying areas 20a-1, a sub-command specifying area 20a-2, an equipment-library specifying area 20a-3, a buffer selecting area 20a-4 and a host-console area 20a-5 as well as a command inputting area 20a-8 at the bottom of the screen. When specifying an item by means of the mouse 20c, point a desired one of the areas 20a-1 to 20a-5 by the mouse 20c and click it.

For example, the sub-command specifying area 20a-2 is clicked. In this case, a list of sub-commands 20a-7 is displayed. A desired sub-command is then selected from the list by the mouse 20c, by pointing the desired sub-command and clicking it. When specifying a desired command, put the mouse 20c on the command specifying areas 20a-1 and carry out similar operations to those for selecting a desired sub-command described above. In this way, the desired command can be specified.

When a command is entered via the keyboard 20b, a string of characters describing the entered command appear on the command inputting area 20a-8. When a command is entered in this way, the command-analysis process 11 is invoked.

Figure 4:
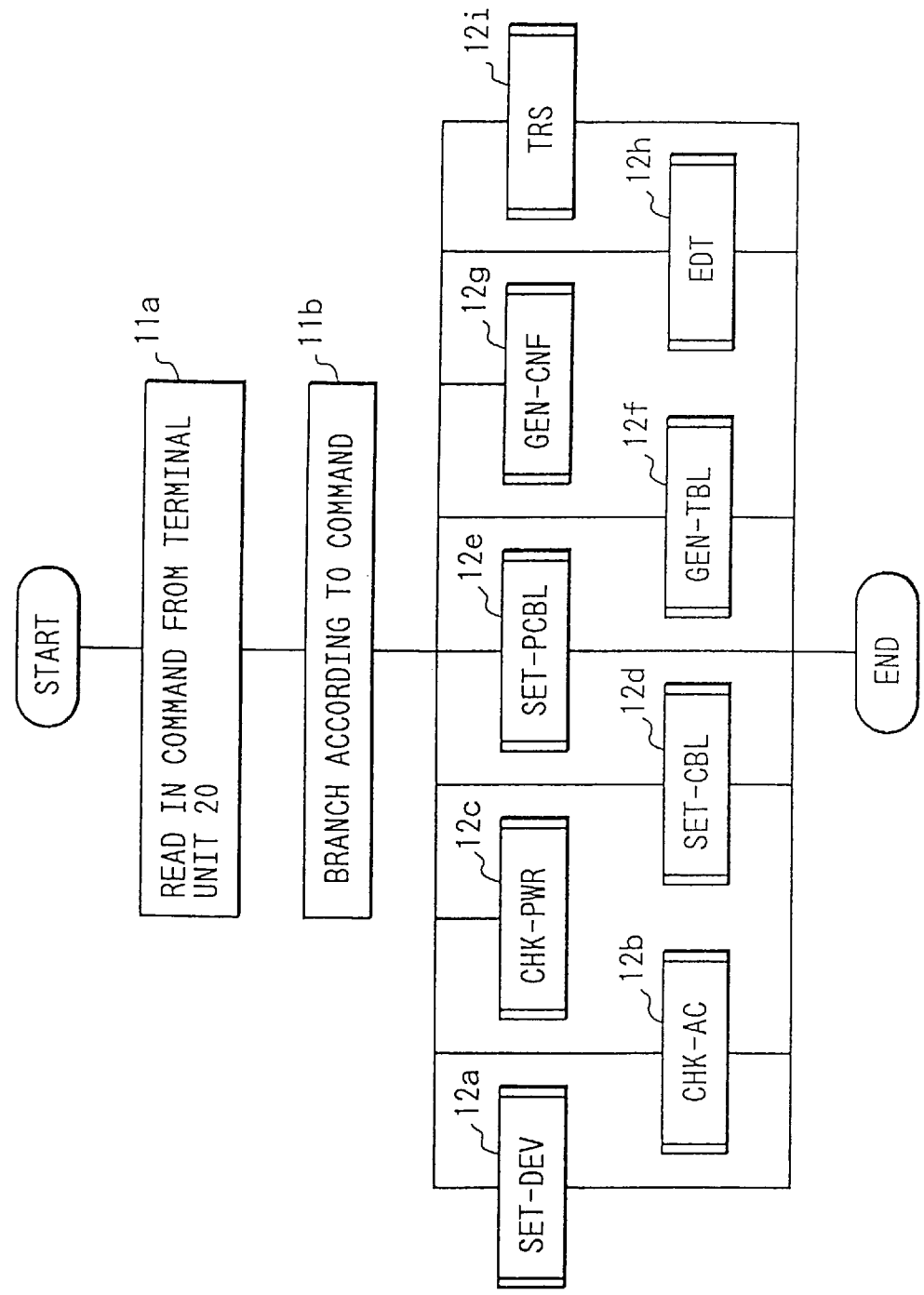
FIG. 4 shows a flowchart of processing to analyze a command.

FIG. 4 shows a processing flow of the command-analysis process 11.

At a step 11a shown in the figure, a command entered from the terminal unit 20 is fetched from the real-screen buffer 19. The flow proceeds to a next step 11b to interpret the command and then to transfer control to one of the command-execution processing sub-programs 12a to 12i which is associated with the command.

The command-execution processing sub-programs 12a to 12i execute commands 1 to 9 respectively shown in FIG. 2. During the execution of a command, the control block 17 and the virtual-screen buffers 18 are used whenever necessary. In addition, the files 23 to 25 are accessed through the file-input/output process 14.

Here, it is nice to briefly explain the contents of the files 23 to 25 before describing the processing of each command.

As described earlier, the equipment-library file 23 is used for storing information on characteristics of pieces of equipment in a broad sense such as dimensions and shapes of the pieces of equipment, the amount of dissipated heat and the amount of consumed power for each piece of equipment as well as the cooling capacity of the air-conditioner and the capacities of the power supplies at each floor. The physical-characteristic file 24 is, on the other hand, used for storing the drawing of each floor. In addition, it is also used for storing equipment-layout drawings resulting from the execution of some commands, the capacities of the power supplies and the cooling capacity of the air-conditioner for each floor, physical characteristics of pieces of equipment in the layout and information on cable connection among the pieces of equipment.

The logical-characteristic file 25 is, by the way, used for storing configuration-defining parameters and information on logical connection among the pieces of equipment generated by the GEN-CNF command.

(1) SET-DEV Command 12a

This command is issued in order to determine a layout of pieces of equipment when installing a new computer system, adding/removing equipment to/from an existing computer system or moving a piece of equipment to another location.

Figure 5:
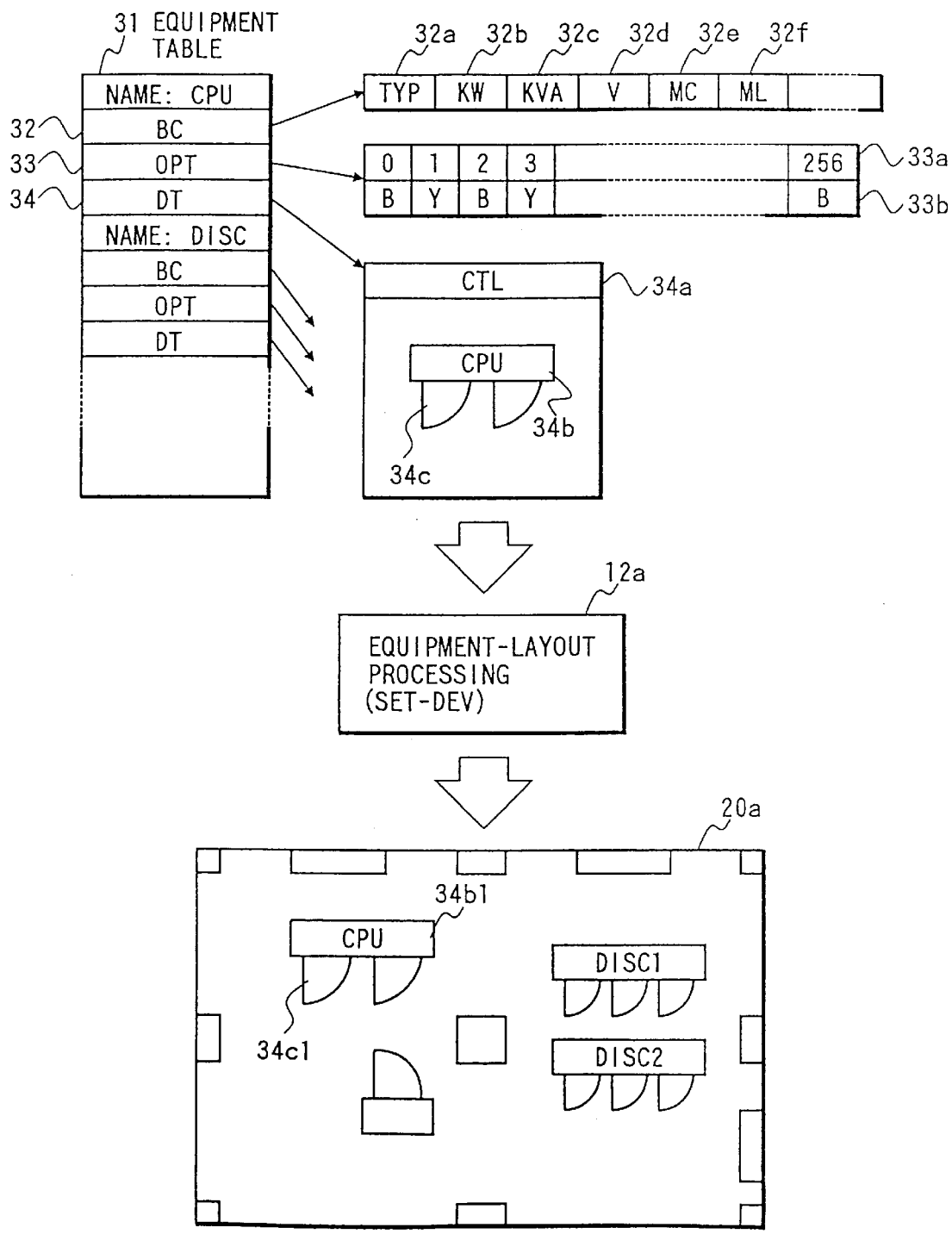
FIG. 5 is a drawing showing an outline of the processing of the SET-DEV command.

FIG. 5 is a model drawing showing an outline of a process to execute this command.

An equipment table 31 describing physical characteristics of each piece of equipment is part of the equipment-library file 23. The equipment table 31 comprises a basic-characteristic field (BC) 32, an option field (OP) 33 and a data field (DT) 34 for each piece of equipment.

The basic-characteristic field 32 includes, among other pieces of information, the type of the equipment (TYP) 32a, the amount of dissipated heat (KW) 32b, the amount of consumed electric power (KVA) 32c and the voltage in use (V) 32d.

The option field 33 includes information on options for the equipment which differs from equipment to equipment. In the case of a CPU, for example, the information includes the type 33b of each channel 33a which can be a block multiplexer channel (B) or a byte multiplexer channel (Y).

The data field 34 includes control information (CTL) 34a indicating actual dimensions (the height, the width and the depth) of the equipment and its scaled-down plane FIG. 34b which includes a figure of a space required for opening and closing a maintenance door of the equipment.

When the user puts the mouse 20c on the equipment-library specifying area 20a-3 on the display screen shown in FIG. 3 and clicks it, an equipment list 20a-6 is displayed. The user then specifies a desired piece of equipment from the list. At that time, FIGS. 34b and 34c of the desired equipment are displayed. The user then specifies a desired position on the plane drawing of the floor appearing on the display unit 20a by putting the mouse 20c on it. As the mouse 20c is clicked, the FIGS. 34b and 34c are copied into the desired position as shown by reference numerals 34b1 and 34c1 respectively.

The processing of the SET-DEV command includes the inspection of whether or not some pieces of equipment overlap each other.

The equipment-overlap inspection also takes the space 34c for opening and closing the door into consideration. Pieces of equipment are laid out in such a way that they include the spaces 34c for opening and closing the doors so they do not overlap each other. In this way, a space for maintenance is also reserved. In addition, in the processing of the SET-DEV command, an apparatus attribute values table showing attributes of the laid-out pieces of equipment and an environment attribute values table showing attributes of installation areas (or floors) are created.

Figure 6:
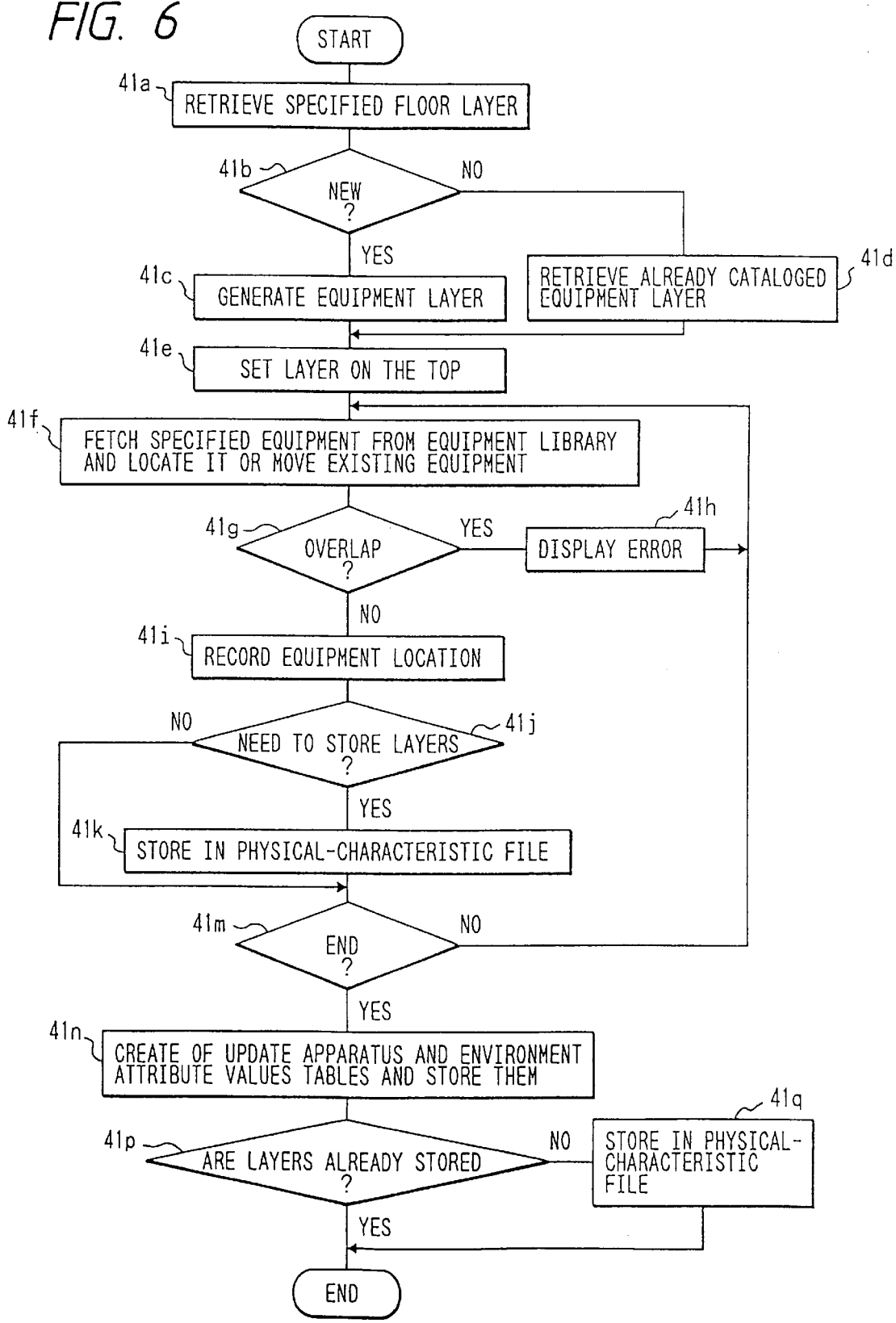
FIG. 6 shows a flowchart of the processing of the SET-DEV command.

FIG. 6 shows a processing flow of an equipment-layout processing program for executing the SET-DEV command.

At a step 41a shown in the figure, the drawing of a floor for installing equipment is retrieved from the physical-characteristic file 24 into one of the virtual-screen buffers (VB0 to VBn).

In this patent specification, a drawing processed by the command-execution process is called a layer. For example, a floor layer means the drawing of a floor.

Figure 7:
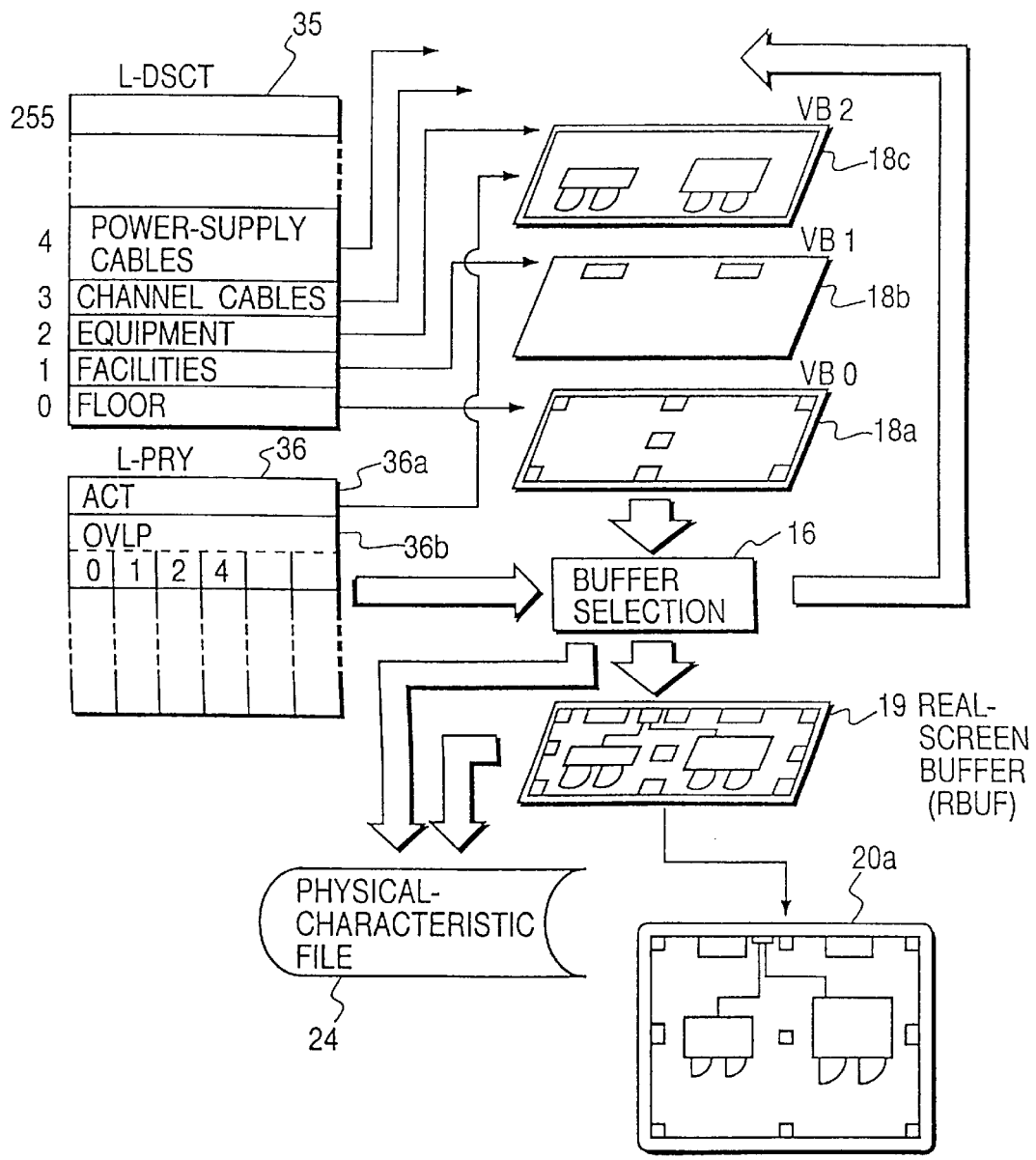
FIG. 7 is a drawing showing relations among a variety of layers.

FIG. 7 is a diagrammatic process of creating an equipment-layout layer, showing a variety of layers simultaneously.

Each layer is controlled by L-DSCT 35 and L-PRY 36, portions of the control blocks 17. The virtual-screen buffers (VB0 to VBn) are each assigned to a layer. The L-DSCT portion 35 shows the assignment of each layer to a virtual-screen buffer whereas the L-PRY portion 36 shows which layers should be shown simultaneously on the screen.

In FIG. 7, the virtual-screen buffers VB0, VB1, VB2 etc. with buffer numbers 0, 1, 2 etc. are assigned to a floor layer, a facility layer, an equipment layer etc. An ACT field 36a in the L-PRY portion 36 indicates that the equipment layer is currently being operated.

An OVLP field 36b of the L-PRY portion 36 shows that the virtual-screen buffers VB0, VB1, VB2 and VB4 should be shown on the screen, overlapping each other. As a result, the floor layer, the facility layer, the equipment layer and the power-supply cable layer overlap each other in the real-screen buffer 19 and are shown on the display unit 20a simultaneously. A new layer created by overlapping a plurality of layers as described above can be stored in an available virtual-screen layer.

Such layer management and buffer management are accomplished by the buffer-selection process 16.

After retrieving a desired floor layer at the step 41a of FIG. 6, the flow proceeds to a step 41b to examine whether or not the installation is to be carried out on a new floor. In the case of installation to be carried out on a new floor, the flow proceeds to a step 41c to generate a new equipment layer. Otherwise, the flow continues to a step 41d to retrieve a relevant cataloged equipment layer from the physical-characteristic file 24. The equipment layer obtained in this way is specified as a top layer at a step 41e. The ACT field 36a shown in FIG. 7 is set to point to this equipment layer.

Steps 41f to 41i are processings to install new pieces of equipment, move or remove existing ones.

At the step 41f, in the case of new-equipment installation, the FIGS. 34b and 34c as well as attribute values 32 and 33 of the new pieces of equipment are retrieved from the equipment library file 23. The FIGS. 34b and 34c are placed at a position on the display screen indicated by the mouse 20c. To put it in more detail, the figures of the equipment are placed at the specified locations on the equipment layer currently being operated. In the real-screen buffer 19, the equipment is superimposed on other layers to form a display screen.

Movement of a piece of equipment to another location on the same floor can be accomplished by pointing the figure of the equipment by the mouse 20c and clicking it and then specifying the other location by using the mouse 20c. Similarly, removal of a piece of equipment can be accomplished by pointing the figure of the piece of equipment by the mouse 20c and clicking it and then requesting the removal. Movement of a piece of equipment from one floor to another is accomplished by using the multi-window function. To put it in more detail, the figure of the equipment on an equipment-layout screen is first pointed by the mouse 20c prior to movement and then the mouse is clicked. Then, a desired location on an equipment-layout screen, the destination of the movement displayed on another window is specified. There, an inter-window communication mechanism works, moving the figure clicked by using the mouse to the desired location specified on the destination window.

The flow then proceeds to a step 41g to inspect if the new or moved equipment coincides with an existing piece of equipment. The inspection is carried out by examining the coordinates and dimensions of the locations of the equipment including spaces for opening and closing doors thereof.

If a result of the inspection indicates that the pieces of equipment overlap each other, the flow proceeds to a step 41h to display an error warning on the screen of the display unit 20a. The flow then returns to the step 41f. The error warning is typically an appropriate error message or accompanied by printing of the figure of the new or moved piece of equipment coinciding with an existing one. In this way, the layout design can be carried forward interactively on a trial-and-error basis until the pieces of equipment do not coincide with each other any more.

If a result of the inspection indicates that the pieces of equipment do not coincide with each other, on the other hand, the flow proceeds to a step 41i to record the coordinates of the equipment.

At steps 41j and 41k, equipment-layout drawings created in the virtual-screen buffers 18 are stored in the physical-characteristic file 24. In addition to the created equipment layers, a layer in the physical-screen buffer 19 which layer is created by superimposing layers on each other is also stored. When a plurality of floors are manipulated by using the multi-window function, the same processing to store layers is carried out for each window.

The flow then continues to a step 41m to examine whether or not the current operation has been completed. If not completed, the flow returns to the step 41f to carry out a layout operation for another piece of equipment.

If completed, on the other hand, the flow proceeds to a step 41n to create or update an apparatus attribute values table and an environment attribute values table and then store them in the physical-characteristic file 24.

Figure 8:
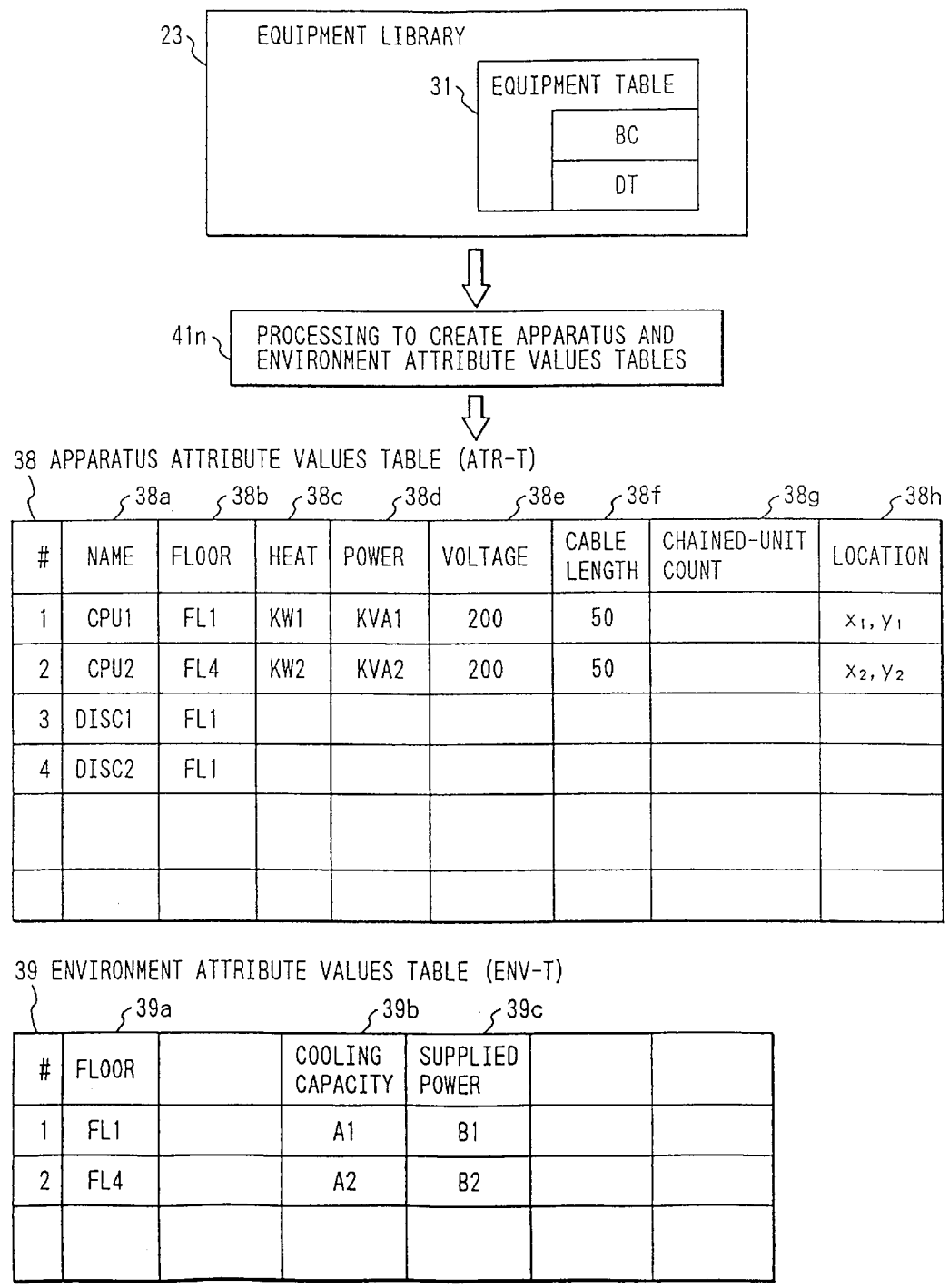
FIG. 8 is a drawing showing an outline of a process for creating an apparatus attribute values table and an environment attribute values table.

FIG. 8 shows diagrammatically an outline of the processing carried out at the step 41n.

The apparatus attribute values table (ATR-T) 38 is created from the contents of a name field, the basic-characteristic field (BC) 32 and the data field (DT) 34 of the equipment table 31 shown in FIG. 5. The contents of the environment attribute values table (ENV-T) 39 are also obtained from the equipment-library file 23.

In this embodiment, air-conditioners and distribution boards are each treated as a piece of equipment. In the case of partial modification of an installed system, data of old versions stored in these tables is read out from the physical-characteristic file 24 and updated.

The apparatus attribute values table 38 includes an equipment name 38a, a floor name 38b, an amount of dissipated heat 38c, an amount of consumed electric power 38d, a power-supply voltage 38e, an allowable cable length 38f, the allowable number of daisy-chained units 38g and equipment-location coordinates 38h.

The environment attribute values table 39, on the other hand, includes a floor name 39a, a cooling capacity 39b and a power-supply capacity 39c. The floor name 38b of the apparatus attribute values table 38 is the same as the floor name 39a of the environment attribute values table 39. The floor names 38b and 39a are used as a keyword in the inspection of the power-supply capacities and the cooling capacity to be carried out later.

As the processing at the step 41n is completed, the flow proceeds to a step 41p to examine whether or not the created layers have already been stored in the physical-characteristic file 24. If not stored yet, the flow continues to a step 41q to store the layers in the physical-characteristic file 24 before completing the processing of the SET-DEV command.

(2) CHK-AC Command 12b

After the layout of pieces of equipment on each floor has been determined to a certain degree, this command is issued to find out whether or not the amount of heat dissipated by the equipment exceeds the cooling capacity of the air-conditioner for each floor.

Figure 9:
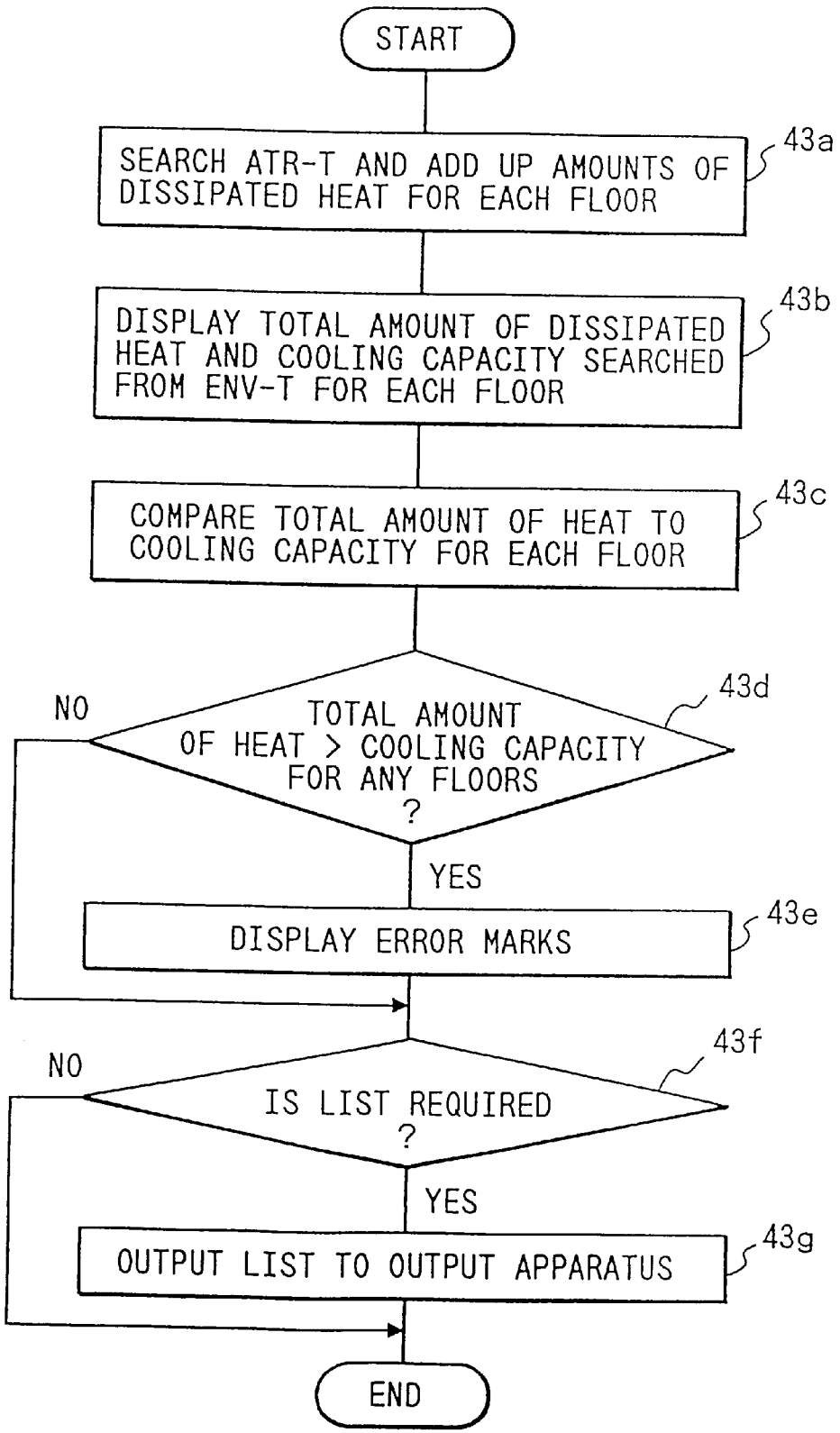
FIG. 9 shows a flowchart of the processing of the CHK-AC command.

FIG. 9 shows the processing flow of the CHK-AC command.

First of all, at a step 43a shown in the figure, the apparatus attribute values table 38 is searched in order to calculate the total amount of dissipated heat 38c at each floor. To put it in more detail, the amounts of dissipated heat of pieces of equipment in the apparatus attribute values table 38 having the same floor name 38a are added up.

At the next step 43b, the environment attribute values table 39 is searched for items having the same floor name 39a as the floor name used as a keyword at the step 43a. The cooling capacities 39b of the floors 39a having the same name as the keyword used at the step 43a are read out to be added up into a total cooling capacity of the floor. The total cooling capacity and the total amount of dissipated hear for each floor are put on a line of a table to be displayed on the display unit 20a.

The flow then proceeds to a step 43c to compare the total amount of dissipated heat with the total cooling capacity for each floor before continuing to a step 43d to determine whether or not a floor with the total amount of dissipated heat exceeding the total cooling capacity exists. If such a floor exists, the flow proceeds to a step 43e to append an error mark to the line of the floor in question in the table displayed at the step 43b.

FIG. 10 is a typical table displayed at the step 43b and an appended error mark indicated by an asterisk 45a.

The flow then proceeds to a step 43f to determine whether or not a request for a list of information obtained at the previous steps exists. If such a request exists, the flow proceeds to a step 43g to request a printing apparatus 27 to output a hard copy of the displayed table such as the one shown in FIG. 10.

(3) CHK-PWR Command 12c

This command is used for checking whether or not the amounts of electrical power consumed by the installed equipment exceed the capacities of the power supplies for each floor. The processing procedure of this command resembles that of the CHK-AC command except that the field for the amount of consumed electrical power 38d is used in place of the field for the amount of dissipated heat 38c in the apparatus attribute values table 38. As for the environment attribute values table 39, the field for the capacities of the power supplies 39c is used in place of the field for the cooling capacity 39b.

FIG. 11 shows typical information resulting from the execution of this command.

An asterisk 46a indicates that the amount of consumed electrical power exceeds the capacities of the power supplies on the floor whereas an asterisk 46b indicates a threshold piece of equipment at which an amount of consumed electrical power just exceeds the capacity of a power supply.

A piece of processing similar to the processing procedures of the CHK-AC and CHK-PWR commands can also be added to the end portion of the processing procedure of the SET-DEV command described earlier, for example, as processing following the step 41n. By so doing, the amounts of dissipating heat and consumed electrical power can be checked as is the case with the determination of the equipment layout.

(4) SET-CBL Command 12d

It is desirable to issue this command and the SET-PCBL command to be explained next after the SET-DEV, CHK-AC and CHK-PWR commands for laying out pieces of equipment, inspecting amounts of dissipated heat and amounts of consumed electrical power respectively as described earlier.

The SET-CBL command checks whether or not the connection of signal cables among laid-out pieces of equipment is proper. The term 'channel cable' used in this patent specification is a generic name for all types of signal cables.

When the execution of this command is started, an equipment layout layer and all layers composing the equipment layout layer are retrieved from the physical-characteristic file 24 along with the relevant apparatus attribute values table and the equipment layout layer is displayed on the display unit 20a.

Figure 14:
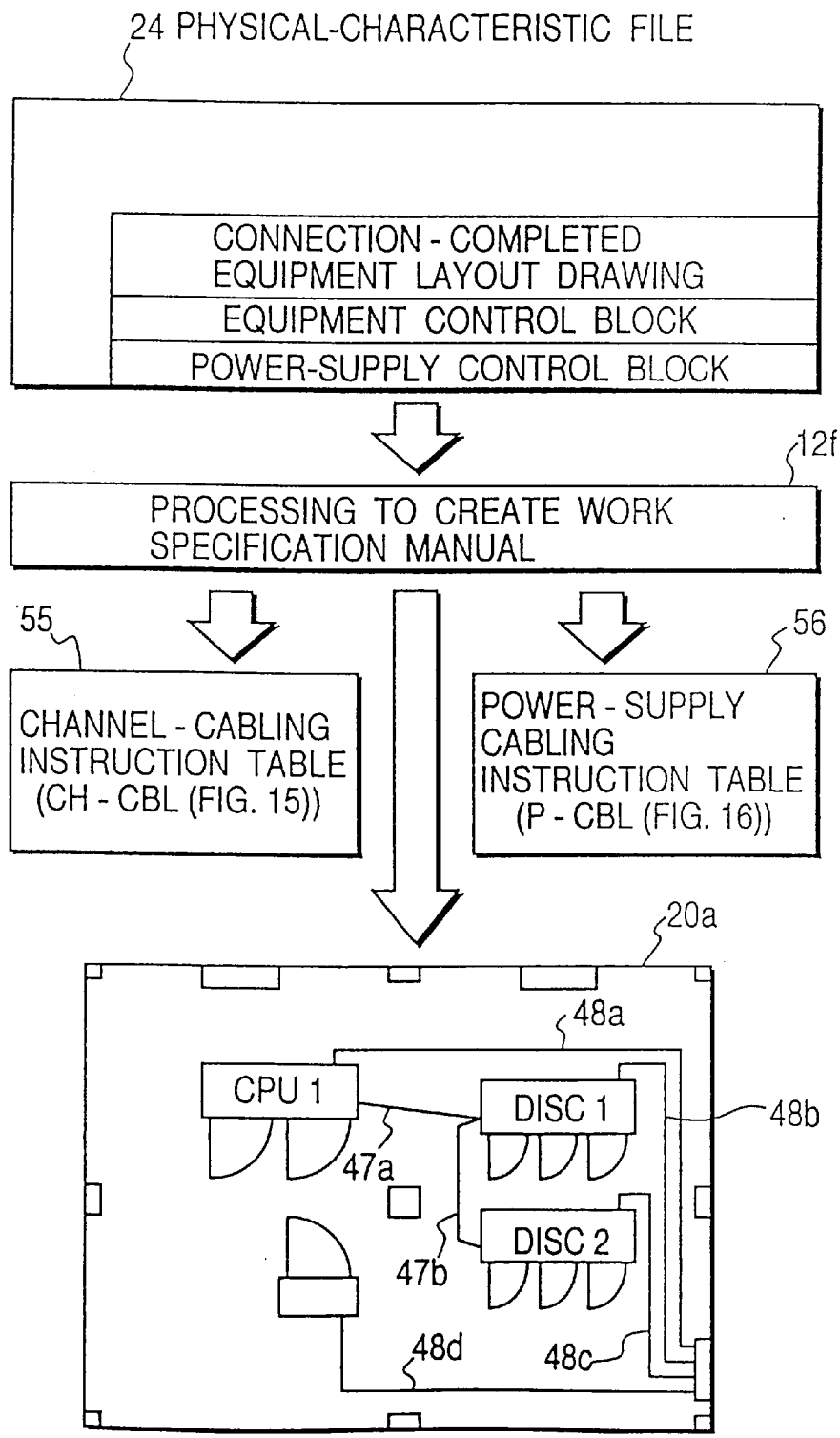
FIG. 14 shows a flowchart of the processing of the GEN-TBL command.

Connection of channel cables is specified on the display screen typically by using a mouse as exemplified by lines 47a and 47b shown in FIG. 14.

Each time a connection is specified, the total of channel-cable lengths for a connected piece of equipment is checked against an allowable cable length 38f to make sure that the former is smaller than the latter. Similarly, the number of daisy-chained units is compared to the allowable number of daisy-chained units 38g to assure that the former is smaller than the latter. Each channel-cable length is computed from data in a coordinate system in a virtual-screen buffer by tracking the connection on the display screen from a start to an end. Subsequently, the calculated channel-cable length is multiplied by a multiplying factor, a ratio of an actual length on a floor to a length in the coordinate system.

If the result of the inspection described above indicates that either condition is not met, an error indication is displayed on the display screen. Typically, the error indication is an error message.

As an alternative, the error can be indicated by blinking the display of a cable line in question. The user can then change the connection in accordance with the displayed error indication.

Figure 12:
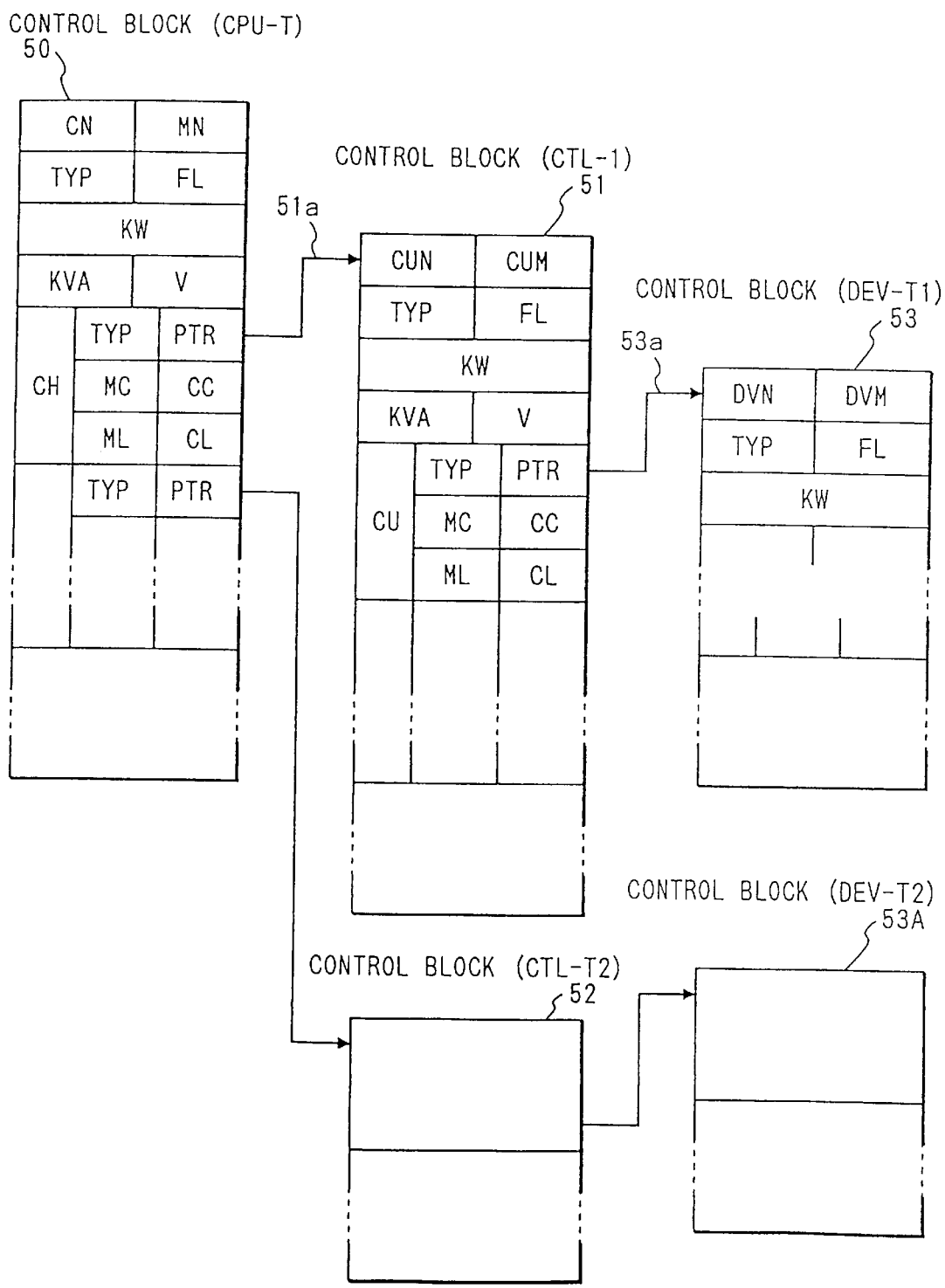
FIG. 12 is a drawing showing a set of typical equipment control blocks for pieces of equipment connected to each other by channel cables.

If both the conditions are satisfied, on the other hand, equipment control blocks 50–53, 53A shown in FIG. 12 are created from the equipment table 31 shown in FIG. 5 and the apparatus attribute value table 38 shown in FIG. 8.

A control block (CPU-T) 50 shown in FIG. 12 is associated with a CPU, whereas control blocks (CTL-T1) 51 and (CTL-T2) 52 are associated with control apparatuses connected to the CPU. A control block (DEV-T1) 53 is, on the other hand, associated with equipment connected to the control apparatuses. Lines 51*a* and 53*a* represent connection specified by a pointer, corresponding to channel cables.

As an example, symbols in the control block 50 and their meanings are listed as follows:

CN—The number of current entries
TYP—Equipment type
KW—The amount of dissipated heat
V—Required power-supply voltage
PTR—Pointer
CC—The number of current daisy-chained units
CL—Current cable length
MN—The maximum number of entries
FL—Installation floor
KVA—Consumed power
CH—Channel
MC—The maximum number of daisy-chained units
ML—Maximum cable length As connection of all required channel cables is completed, the various created control blocks and the equipment layout drawing with its wiring done are stored in the physical-characteristic file 24.

(5) SET-PCBL Command 12*e*

This command is issued to carry out the same processing as the SET-CBL command described earlier for connection of power-supply cables. A power-supply control block (BK-T) 54 shown in FIG. 13 is created and stored in the physical-characteristic file 24 along with the equipment layout drawing for which connection has been completed.

Connection of power-supply cables is specified on the display screen as exemplified by lines 48*a* to 48*d* shown in FIG. 14. The actual length of a power-supply cable is computed in the same way as a channel cable. The power-supply control block 54 includes a breaker name, connected equipment names, the power-supply voltage, the breaker breaking current and the power-supply cable length for each power-supply cable.

(6) GEN-TBL Command 12*f*

This command is used for creating a manual describing cabling work instructions which comprise a channel cabling instruction table, a power-supply cabling instruction table and connection-completed equipment layout table.

FIG. 14 diagrammatically shows an outline of the processing of the GEN-TBL command.

With the execution of this command, the equipment control blocks, the power-supply control block and the connection-completed equipment layout drawing shown in FIGS. 12 and 13 are retrieved from the physical-characteristic file 24. The connection-completed equipment layout drawing is then stored in the virtual-screen buffers 18.

Subsequently, the equipment control block and the power-supply control block are searched one after another to fetch cabling information which is used for creating a channel cabling instruction table (CH-CBL) 55 and a power-supply cabling instruction table (P-CBL) 56.

The connection-completed equipment layout drawing is displayed on the display unit 20*a*. Lines 47*a* and 47*b* are examples of channel cables whereas lines 48*a* to 48*d* are examples of power-supply cables. The channel cabling instruction table (CH-CBL) 55, the power-supply cabling instruction table (P-CBL) 56 and the connection-completed equipment layout drawing are stored in the logical-characteristic file 25. In addition, their hard copies are also output to the printing apparatus 27 as well.

Details of the channel cabling instruction table (CH-TBL) 55 are shown in FIG. 15. A NAME field 55*a* shows the name of equipment whereas a SLOT field 55*b* shows the number of a channel. FROM and TO fields 55*c* and 55*d* show the start and end of a cable respectively. A LENGTH field 55*e* shows a cable length whereas a TYPE field 55*f* shows the type of a cable such as a metal cable, an optical cable or others.

Details of the power-supply cabling instruction table (CH-TBL) 56 are shown in FIG. 16. A NAME field 56*a* shows the name of equipment whereas a BREAKER field 56*b* shows the name of a breaker. V and A fields 56*c* and 56*d* show a voltage and a breaker breaking current respectively. A TO field 56*e* shows the name of connected equipment whereas a LENGTH field 56*f* shows the length of a power-supply cable.

By referring to the channel cabling instruction table (CH-TBL) 55, the power-supply cabling instruction table (P-CBL) 56 and the connection-completed equipment layout drawing, the workers can smoothly execute the cabling work at a variety of stages, from the receiving of equipment to the installation of cables.

(7) GEN-CNF Command 12*g*

This command is used for creating a logical configuration drawing showing logical relation and connection among pieces of equipment composing a computer system and configuration defining parameters required by an OS running on the computer system.

Figure 17:
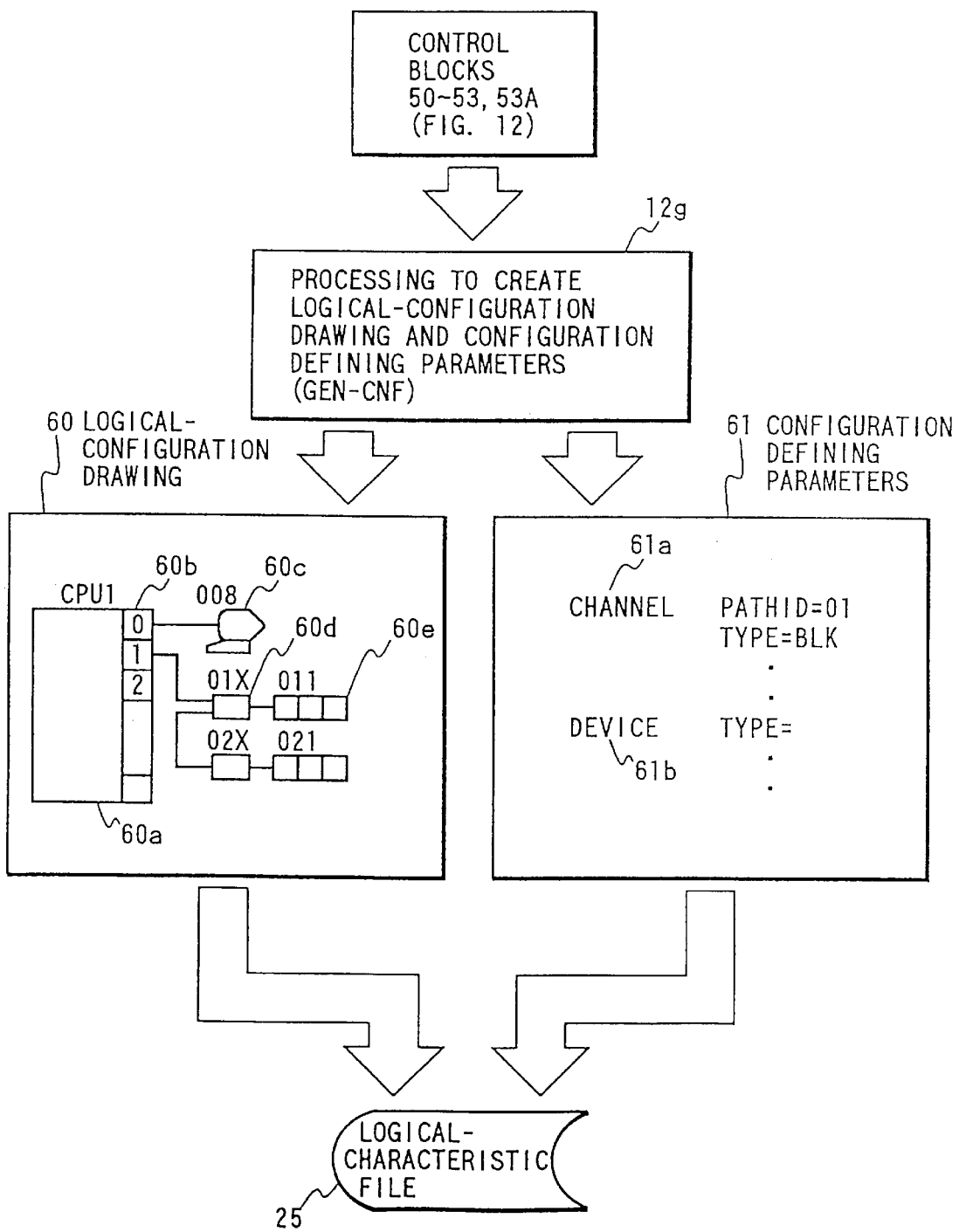
FIG. 17 shows a flowchart of the processing of the GEN-CNF command.

FIG. 17 diagrammatically shows an outline of the processing of the GEN-CNF command.

First of all, equipment control blocks 50–53, 53A as shown in FIG. 12 are retrieved from the physical-characteristic file 24. Subsequently, search operations are carried out starting with the CPU control block 50 before continuing to the control blocks 51 to 53, 53A one after another. Each time a control block is encountered, types of equipment described therein are fetched and associated FIGS. 60*a*, 60*c*, 60*d* etc. determined in advance are arranged in a virtual-screen buffer VBn. In addition, connection lines among the pieces of equipment are drawn to create a logical-configuration drawing 60.

Configuration defining parameters 61 are created at the same time as the processing described above by generating strings of characters for defining the configuration of each piece of equipment. For example, character strings 61*a* and 61*b* are generated for the channel 60*b* and the equipment 60*e* respectively.

Details of the procedure of generating configuration defining parameters will be explained below. Each of the configuration defining parameters 61 comprises a label field, a function field, and an operand field, and those fields are separated by a blank. The label field can be omitted. The configuration defining parameters 61 are generated from the control blocks shown in FIG. 12, when the GEN-CNF command is executed. The outline of the configuration defining parameters which correspond to the group of pieces of equipment illustrated in the logical configuration drawing 60 shown in FIG. 17 is illustrated in FIG. 17, as the configuration defining parameters 61, but FIG. 19 shows more details of the configuration defining parameters 61.

Figure 20:
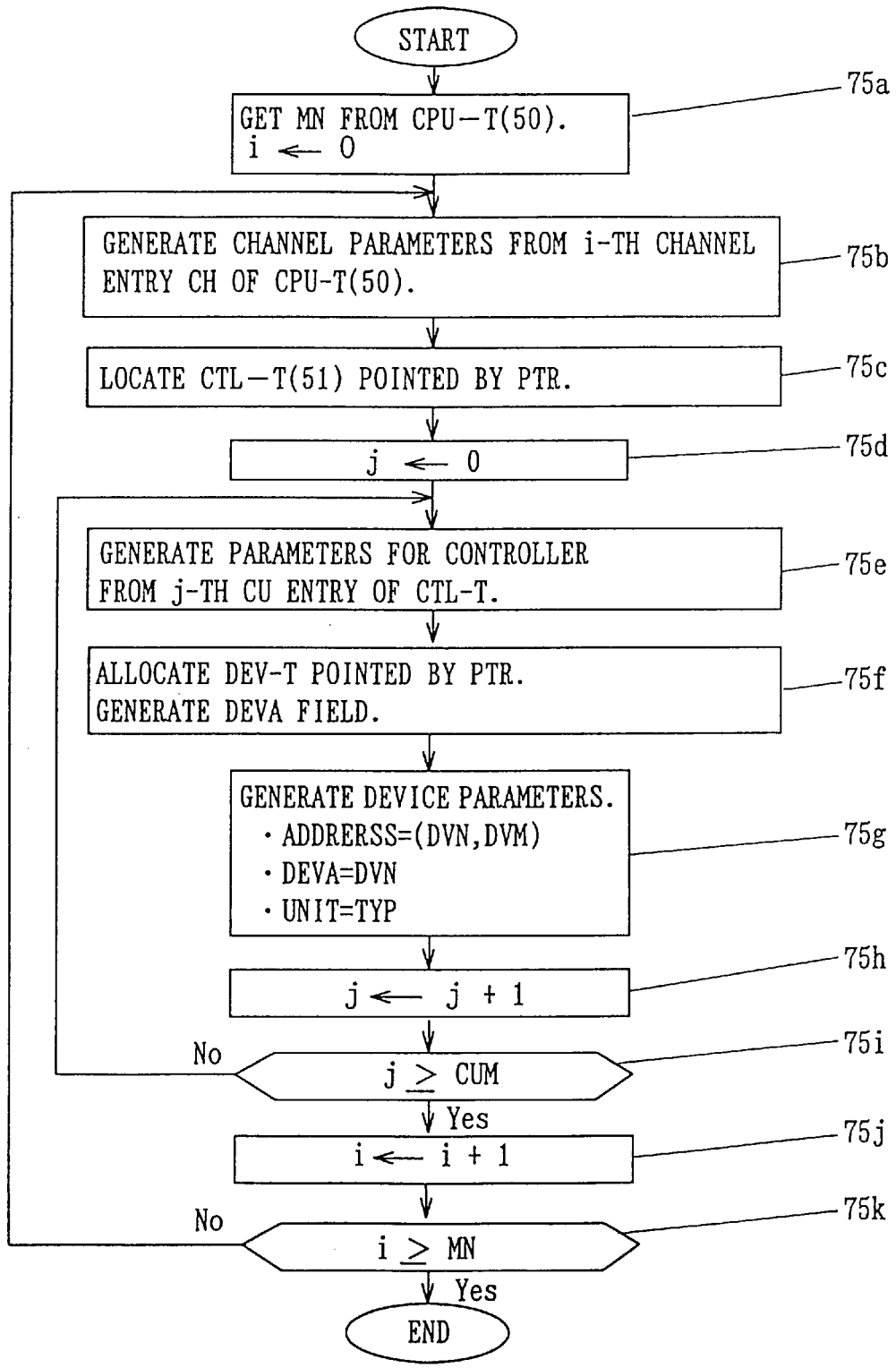
FIG. 20 shows the flow chart of the processing of generating the configuration defining parameters.

FIG. 20 shows the procedure of generating the configuration defining parameters by the GEN-CNF command. In the processing step 75*a*, the maximum entry number MN is obtained from the first control block CPU-T (50) of FIG. 12. The count value i is initialized to zero. The processing steps 75*b* to 75*k* are repeated by the maximum entry number MN in the control block CPU-T (50). In the processing step 75*b*, channel parameters in the configuration defining parameters are generated based on the contents of the i-th entry. In the present example, the configuration defining parameter 66 shown in FIG. 19 is generated. To be more concrete, the channel number CH held in the entry CH is stored in the PATHID operand. The value of the equipment type field TYP corresponding to the channel number entry CH of FIG. 12 is stored in the TYPE operand. When the count value i is updated to 1 and 2 later on, the configuration defining parameters 67 and 68 are generated respectively in the same way. If a null code (e.g. a numeral of −1) is held in the channel number entry CH, the i-th channel is not present and the configuration definition parameters are not generated. The processing proceeds to the processing step 75*j*.

Next, in the processing step 75*c*, the control block CTL-T1 (51) for a controller connected to the channel under processing is located based on the pointer PTR corresponding to the channel number entry CH. This control block contains information on the I/O controllers connected to the channel under processing. When neither a controller nor an input-output device is connected to the channel under processing, a flag (a null code) which shows that the value of the pointer is not set is stored in the pointer PTR corresponding to the channel number entry CH. The null code can be represented, for example, by a numerical value 0 or −1. If the null code is set in the pointer PTR, the processing proceeds to the processing step 75*j* without executing the processing steps 75*c* to 75*i*.

The counter j is initialized to zero by the processing step 75*d*. The processing steps 75*e* to 75*i* are ones which generate the configuration defining parameters for a controller, concerning I/O controllers and input-output devices connected to the channel under processing. These processings are repeated by the maximum entry number CUN in the control block CTL-T1 (51) for a controller. The maximum number CUN of entries shows the total number of the I/O controllers connected to this channel.

The processing step 75*e* generates configuration defining parameters other than the DVN and DVM fields, among the configuration defining parameters 69 for a controller shown in FIG. 19. The controller number CU of FIG. 12 is stored in the CUN0 field, the channel entry number CH used in the processing step 75*b* is stored in the PATHID field, and the value of the equipment type field TYP corresponding to the entry CU is stored in the TYPE field, respectively. In the processing step 75*f*, the control block DEV-T1 (53) for a device, as pointed by the pointer PTR corresponding to the CU entry is allocated. The set of the device number DVN and the number DVM of connected devices in this block is used for the device address DEVA in the configuration definition parameter 69. For instance, when it is assumed that DVN is 08 and DVM is 1, DEVA of the parameter 69 becomes (08, 1). The configuration definition parameters 70 and 71 are generated for different values of the counter j in the same way.

In the processing step 75*g*, a configuration defining parameter IODEVICE for a device, for example 72, is generated for each of the devices registered in the control block DEV-T1 (53). Here, the value of the device number DVN and the number DVM of the connected devices are stored in the ADDRESS field. The value of DVN is stored in the device address DEVA, and the value of equipment type field TYP in the control block 53 is stored in the UNIT field, respectively.

Next, the counter j is counted up by one in the processing step 75*h*. The entry number j of the control block for a controller is checked in the processing step 75*i*. The processing returns to the processing step 75*e*, if the entry number j has not reached CUM. When the entry number j has reached CUM, the count value i of the channel entries is counted up by one in the processing step 75*j*. In the processing step 75*k*, it is inspected whether the count value i has reached the number MN of repetition. The processing returns to the processing step 75*b*, if the count value has not reached the number MN of repetition. If the count value i has reached the number MN of repetition, the processing of generating the configuration defining parameters corresponding to the connection relation of the control blocks shown in FIG. 12.

The logical-configuration drawing 60 and the configuration defining parameters 61 created in this way are stored in the logical-characteristic file 25. If necessary and, in particular, if the configuration-management aiding apparatus 100 has not been connected to the computer system, the configuration defining parameters 61 are further output to a floppy disc through the floppy-disc drive 26. Furthermore, the logical-configuration drawing 60 and the configuration defining parameters 61 can be displayed in the display unit 20*a* or their hard copies can also be produced by the printing apparatus 27.

(8) EDT Command 12*h*

This command is prepared for partially correcting the configuration defining parameters.

For example, when the system-generation processing program 8 of the computer system 1 runs in accordance with the configuration defining parameters created by the configuration-management aiding apparatus 100, generating an error, in many cases, the error can probably be eliminated by slightly correcting the configuration defining parameters.

Similarly, when very few pieces of equipment of an already installed computer system are to be modified, the configuration defining parameters need to be corrected slightly. In this case, it will be terribly troublesome to redesign the equipment layout by using the SET-DEV command and others described so far. In such a case, the EDT command is useful instead.

The user specifies a file name of the configuration defining parameters by operating the terminal unit 20 and enters the EDT command. For the sake of explanation clarity, refer to FIG. 1. In response to this command, a specified configuration defining parameter is read out from the logical-characteristic file 25 into one of the virtual-screen buffers (VB0 to VBn) and then output to the display unit 20*a* through the real-screen buffer 19. The desired configuration defining parameter is corrected on the screen. The corrected configuration parameter is finally stored in the logical-characteristic file 25 and, if necessary, stored in a floppy disc.

(9) TRS Command 12*i*

This command is used for transferring configuration defining parameters stored in the logical-characteristic file 25 to the computer system 1. When this command is entered via the terminal unit 20 along with the file name of the configuration defining parameters, the configuration defining parameters of the specified file name are read out from the logical-characteristic file 25 to a virtual-screen buffer VBn and then transferred to the configuration-information file 6 of the computer system 1 through the transmission/reception process 13 and the cable L2. The transfer of the configuration defining parameters allows the system-generation processing program 8 to immediately carry out the system-generation processing in accordance with the configuration defining parameters stored in the configuration-information file 6.

The system-generation processing program 8 of the computer system 1 can be invoked directly from the terminal unit 20 of the configuration-management aiding apparatus.

That is to say, the configuration-management aiding apparatus 100 functions also as a console or a terminal unit of the computer system 1. A message from the computer system 1 is received by the configuration-management aiding apparatus 100 through the cable L1. Similarly, a command entered by the operator via the configuration-management aiding apparatus 100 is transmitted to the computer system 1 also through the cable L1.

To put it in more detail, a message from the computer system 1 travels through a communication path starting at the cable L1, followed by the transmission/reception process 13 and the virtual-screen buffer 18 and ending at the real-screen buffer 19 before being displayed in the display unit 20a of the terminal unit 20. A command entered by the operator to the terminal unit 20 is, on the other hand, passed on to the computer system 1 through a communication path in the reversed order to that of a message: the real-screen buffer 19, then to the virtual-screen buffer 18, then to the transmission/reception process 13 and finally to the cable L1 before arriving at the computer system 1.

The fact that the computer system 1 and the configuration-management aiding apparatus 100 share the terminal unit 20 is one of the features offered by the present invention.

This feature allows a sequence of operations listed below to be carried out in the system shown in FIG. 1 by using the terminal unit 20 only even after the transmission of configuration defining parameters to the computer system 1 has been completed.

(a) The terminal unit 20 functions as a console of the computer system 1, allowing the user to perform system generation by invoking the system-generation processing program 8 therefrom.

(b) When the system-generation processing program 8 detects an error in configuration defining parameters, an error message is displayed in the display unit 20a of the terminal unit 20.

(c) The terminal unit 20 functions as a console of the computer system 1, allowing the user to correct configuration defining parameters stored in the logical-characteristic file 25 by entering an EDT command thereto.

(d) A TRS command can be used to transmit configuration defining parameters from the logical-characteristic file 25 in the terminal unit 20 to the configuration-information file 6 of the computer system 1.

(e) The terminal unit 20 functions as a console of the computer system 1, allowing the user to invoke the system-generation processing program 8 therefrom.

Figure 18:
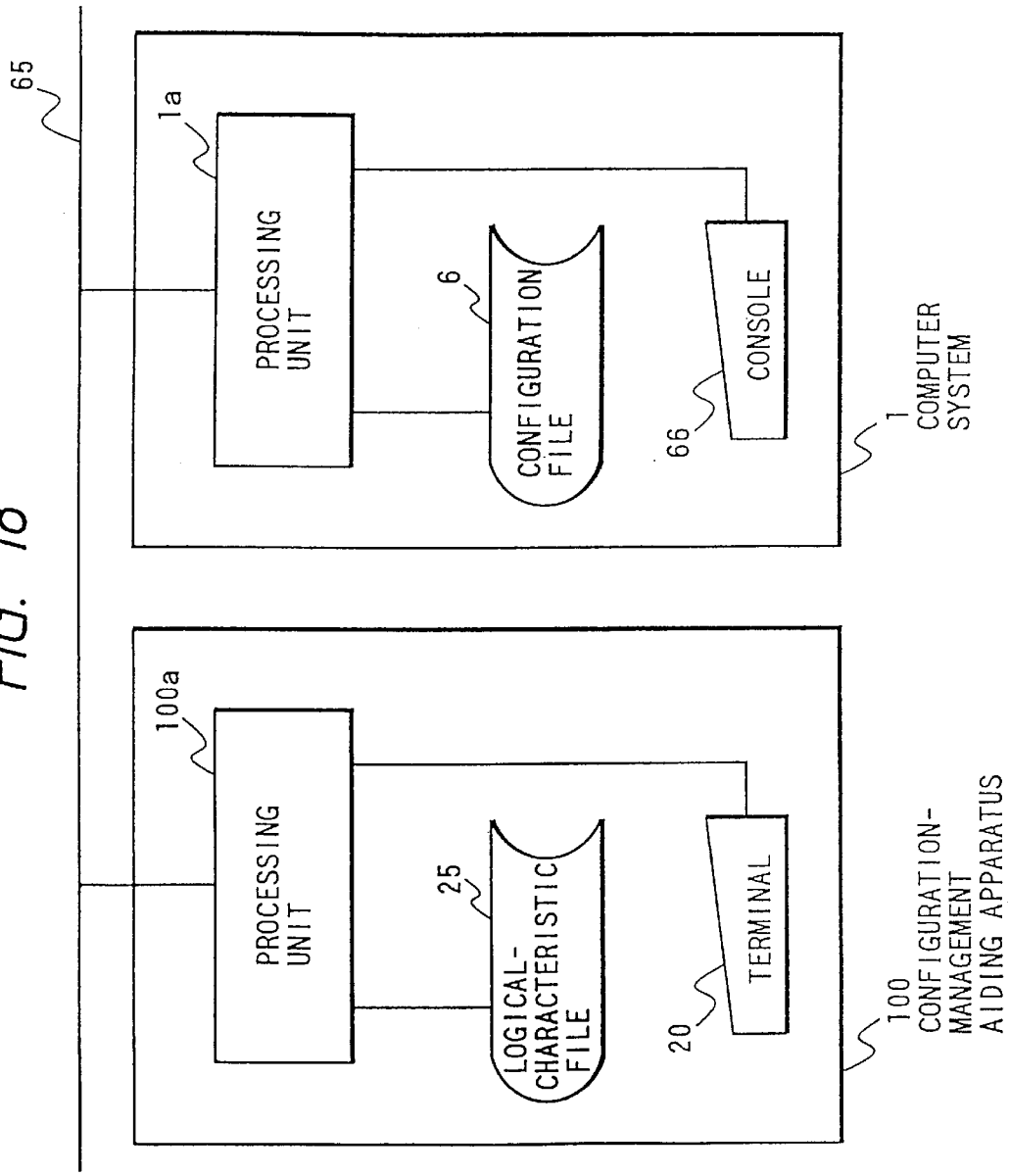
FIG. 18 is a block drawing of another embodiment provided by the present invention.

The connection between the configuration-management aiding apparatus 100 and the computer system 1 can be implemented by means of a communication line. Such an embodiment is shown in FIG. 18.

In the embodiment shown in the figure, the configuration-management aiding apparatus 100 is connected to the computer system 1 through an Ethernet LAN (Local Area Network) 65. Configuration defining parameters created in the configuration-management aiding apparatus 100 are read out from the logical-characteristic file 25 in response to a TRS command and output to the Ethernet LAN 65 with the computer system 1 taken as a destination. The OS of the computer system 1 receives the configuration defining parameters bound for the computer system 1, storing them into the configuration-information file 6.

In such a scheme, the computer system 1 has a console 66 of its own, via which console 66, the system-generation processing program is invoked.

In the case of another embodiment provided by the present invention, the configuration-management aiding apparatus 100 functions as a completely independent system. That is to say, there is no connection between the computer system 1 and the configuration-management aiding apparatus 100. In such a scheme, configuration defining parameters are supplied to the computer system 1 by means of a transportable storage medium such as a floppy disc. The configuration-management aiding apparatus 100 in this embodiment can be implemented by a still more compact personal computer.

The function of aiding the configuration management of the present invention can be applied in aiding the arrangement of a group of servers each of which comprises a workstation (WS) or a personal computer (PC). Some servers are used commonly by many users, but others may be used each only by a specific user. The latter servers may be placed near a client machine of such a specific user. Recently, however, it often occurs that a group of servers including the latter servers are arranged in a common computer room. This is because such arrangement has big merits that such arrangement enables concentration of power supply equipment and air conditioning apparatuses and unified management of those servers. Hundreds of or thousands 1 of servers may be installed in a common computer room in some cases. The present invention is especially effective, when such a lot of servers are installed in a common computer room.

Figure 21:
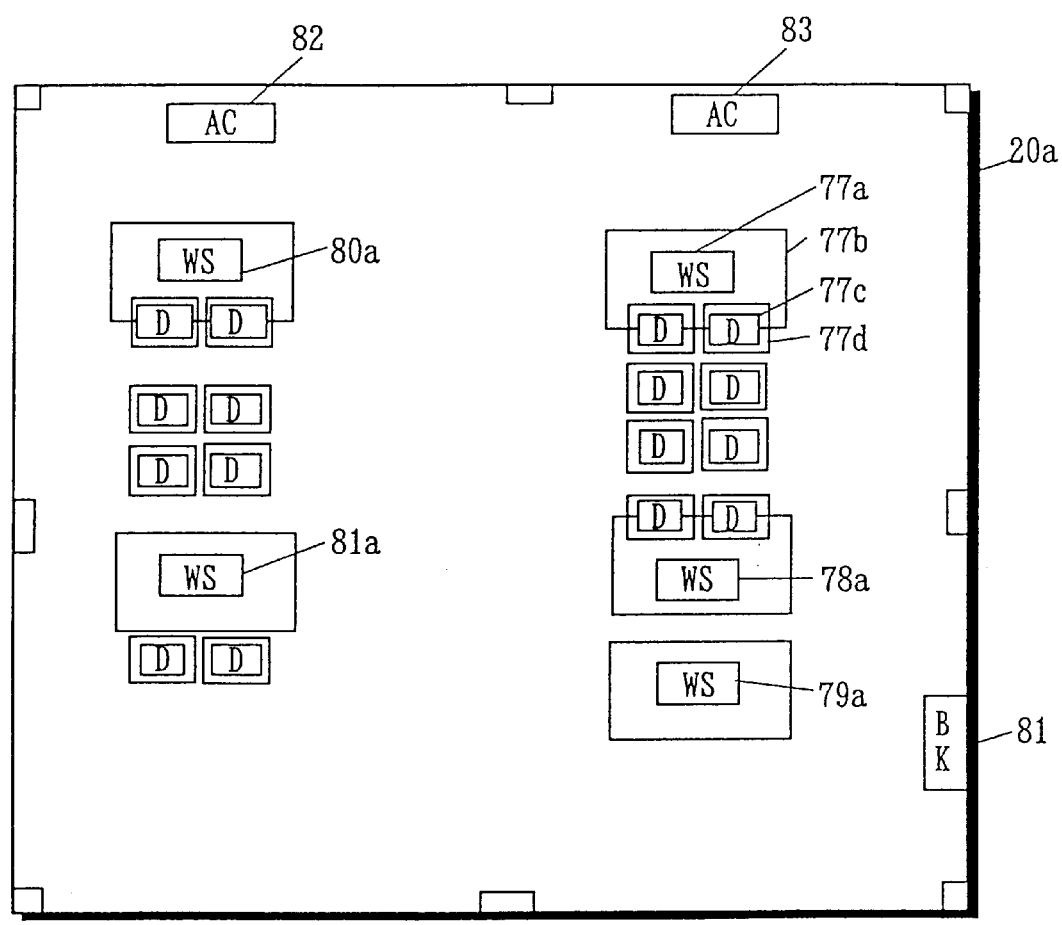
FIG. 21 shows a group of servers installed in a computer center.

FIG. 21 shows a screen 20a of the display device 20 (FIG. 1) which shows the arrangement of plural pieces of equipment in a common computer room (computer center) where the group of servers are installed. In the drawing, the workstations and hard disks are shown only for part of the whole servers expected to exist in the computer room for the sake of simplicity. Each server is assumed to have a workstation (WS) and one or plural external storage devices such as magnetic disks storage devices called hard disks (D). Of course, a personal computer can be used in place of the workstation. For instance, the reference numerals 77a, 78a, 79a, 80a, and 81a illustrates workstations (WS) for different servers. A block, for example 77a, which includes the letter WS inside illustrates an area which a workstation occupies. A block, for example 77b, which includes the letter D inside illustrates an area which a hard disk occupies. It is usual that the input-output devices such as magnetic storage devices are connected in a daisy chain fashion according to the SCSI (Small Computer System Interface) standard.

The reference numerals 82 and 83 illustrate air-conditioning machines installed in the computer center, and 77c illustrates a hard disk for the server comprising the workstation 77a. The reference numeral 81 illustrates a group of breakers to supply electric power to the group of servers.

The configuration management technology used in the previous embodiment can also be applied to management of configuration of such a group of servers. That is, it is possible to apply the commands shown in FIG. 2, by correcting part thereof. In the following, the points of the present embodiment different from the previous embodiment will be briefly explained.

In FIG. 21, the rectangular block, for example 77b, surrounding a workstation, for instance 77a, illustrates the area which is required for a user or a system manager to access the workstation 77a for maintenance purpose, and the size is set to be one (called a redundant size) larger than the actual size of the workstation 77a. Similarly, the rectangular block, for example 77d, surrounding a hard disk, for instance 77c, illustrates a redundant size of the hard disk. The redundant size includes a region for opening a door of each of those devices.

The redundant size and the actual size of each of the workstations and the hard disks are stored in the data field 34 of the part table 31 shown in FIG. 5. The area indicative of an actual size and the area indicative of the redundant size of each of the workstations and the hard disks are shown on the display screen 20a by using the stored data. When the presence of overlap of the pieces of equipment is inspected during execution of the SET-DEV command, by the step 419 in the layout processing shown in FIG. 6, the redundant size is used for each equipment. FIG. 21 shows several workstations whose redundant sizes overlap the redundant sizes of their neighboring hard disks.

During the checking of the appropriateness of the cable length during execution of the SET-CBL command, the maximum length of a cable predetermined for the SCSI equipment is used. The control blocks shown in FIG. 12 is generated for each of the group of servers. However, the term "channel" used in the previous embodiment should be replaced by "I/O slot" or "I/O board" in applying the previous embodiment to the present embodiment. In case of the servers assumed in the present embodiment, it is usual that there is no controller which controls the input-output devices. So, no control block CTL-T (51 or 52) for a controller is generated. The pointer PTR corresponding to the channel number entry CH of CPU-T 50 directly points the control block DEV-T1 (53).

When plural input-output devices are connected in parallel to an I/O slot in a daisy-chain fashion, the control block DEV-T (53 or 54) for a device is generated for each input-output device. A pointer is stored in an entry (not shown) provided in each control block for a device, and the pointer in one of the control blocks points to a succeeding one of those control blocks for a device, whereby those control blocks are linked together.

The data in these control blocks can be effectively used to aid the judgement as to how many input-output devices are connected to the present I/O slot or I/O board of each server in parallel and the judgement as to how many more input-output devices can be further connected to it.

Moreover, because the relation of the input-output device to which each I/O slot or I/O board is connected is established by each entry CH, as shown in FIG. 12, it is possible to judge which input-output device is connected to each I/O slot or I/O board.

The I/O slot registered in the entry CH shown in FIG. 12 is translated into the IRQ (Interrupt Request Queue) number, and a number (I/O port number) of an I/O processing program is assigned for the IRQ number. For instance, if the 11th SCSI slot is allocated to the channel number entry CH in FIG. 12, IRQ will become 11, and an I/O port number corresponding to the input-output program for the SCSI slot is assigned. A processing program area in a real memory is also secured.

The control blocks shown in FIG. 12 are generated for each server, as already described. A group of definition sentences which compose the configuration defining file used to activate each server can be generated automatically for each server by amending the processing procedure shown in FIG. 20 to what follows.

When OS (Operating System) which controls each server is UNIX, each definition sentence of the file "/in user/sr./Unix/.config," which is the configuration defining file, is generated in correspondence to each I/O slot. For instance, for the SCSI board, the configuration defining file including the following definition sentences are generated.

CONFIG_SCSI=y

CONFIG_BLK_DEV_SD=y

The term "y" means "yes", and the definition sentence implicitly designates incorporation of the I/O processing program for SCSI.

In case of a server which comprises PC, plural definition sentences shown below which constitute "config.sys" file used as a configuration defining file are also generated automatically for the SCSI board.

DEVICE=C:¥SCSI¥ASPI8DOS.SYS/D

DEVICEHIGH/L:1,15744=C:¥SCSI¥ASPDISK.SYS/D

The present invention allows a sequence of jobs comprising the design of an equipment layout, the design of various connections and the creation of configuration defining parameters in the installation of a new computer system or partial modification of the configuration of an already installed computer system to be carried out by means of a computer in a uniform manner and, at the same time, allows the appropriateness of the designs to be examined.

As a result, there is much less necessity to depend on experiences of individual system engineers in accomplishing the jobs and the number of design mistakes is reduced. On top of that, a lack of prepared manuals can be avoided, allowing the installation work to be carried out smoothly.

What we claim is:

1. A program storage medium which stores a program for aiding arrangement of a plurality of pieces of equipment into a space for a computer center, by using a computer, wherein each of the plurality of pieces of equipment comprises a processor or an auxiliary storage device, wherein said program is programmed so as to cause the following steps to be executed by said computer:

deciding appropriate installation locations of said plurality of pieces of equipment through an interactive operation with a user, by using a drawing of an installation area of said space displayed on a display screen of a display device connected to said computer;

deciding mutual connection between said plurality of pieces of equipment, based on an instruction by the user, after said installation locations of said plurality of pieces of equipment have been decided; and generating data for aiding work to install said plurality of pieces of equipment at said computer center, based on said installation locations and said mutual connection decided for said plurality of pieces of equipment.

2. A program storage medium according to claim 1, wherein said data comprises at least data representing a connection-completed equipment layout drawing which shows arrangement and connection of said plurality of pieces of equipment.

3. A program storage medium according to claim 1, wherein said plurality of pieces of equipment comprise at least one processor which uses a plurality of channels and a plurality of auxiliary storage devices which said at least one processor uses;

wherein said step of deciding the connection includes a step of deciding connection of said plurality of channels and said plurality of auxiliary storage devices.

4. A program storage medium according to claim 1, wherein said plurality of pieces of equipment comprise a plurality of processors each for constituting one of a plurality of servers and a plurality of auxiliary storage devices each used by either one of said plurality of servers;

wherein said step of deciding the connection includes a step of deciding connection of said plurality of processors and said plurality of auxiliary storage devices.

5. A program storage medium which stores a program for aiding arrangement of a plurality of pieces of equipment into a space for a computer center, by using a computer, wherein each of the plurality of pieces of equipment comprises a processor or an auxiliary storage device, wherein said program is programmed so as to cause the following steps to be executed by said computer:

deciding mutual connection between said plurality of pieces of equipment through an interactive operation with a user, by using a plurality of figures displayed on a display device connected to said computer; and generating data representing a logical configuration drawing which shows mutual logical connection of said plurality of pieces of equipment, based on said mutual connection decided for said plurality of pieces of equipment and characteristics thereof.

6. A program storage medium according to claim 5, wherein said plurality of pieces of equipment comprise at least one processor which uses a plurality of channels, and a plurality of auxiliary storage devices used by said at least one processor;

wherein said step of deciding the connection includes a step of deciding connection of said plurality of channels and said plurality of auxiliary storage devices;

wherein said data representing said logical configuration drawing comprises data which shows logical connection of said plurality of channels and said plurality of auxiliary storage devices.

7. A program storage medium according to claim 5, wherein said plurality of pieces of equipment comprise a plurality of processors each for constituting one of a plurality of servers and a plurality of auxiliary storage devices each used by either one of said plurality of servers;

wherein said step of deciding the connection includes a step of deciding connection of said plurality of processors and said plurality of auxiliary storage devices;

wherein said data representing said logical configuration drawing comprises data which shows logical connection of said plurality of processors and said plurality of auxiliary storage devices.

8. A program storage medium which stores a program for aiding arrangement of a plurality of pieces of equipment into a space for a computer center, by using a computer, wherein each of the plurality of pieces of equipment comprises a processor or an auxiliary storage device, wherein said program is programmed so as to cause the following steps to be executed by said computer:

deciding appropriate installation locations of said plurality of pieces of equipment through an interactive operation with a user, by using a drawing of said space displayed on a display device connected to said computer;

deciding mutual connection between said plurality of pieces of equipment, based on an instruction by the user, after said installation locations of said plurality of pieces of equipment have been decided; and generating data for operating said plurality of pieces of equipment, based on said mutual connection decided for said plurality of pieces of equipment and characteristics thereof.

9. A program storage medium according to claim 8, wherein said plurality of pieces of equipment comprise at least one processor which uses a plurality of channels and a plurality of auxiliary storage devices which said at least one processor uses;

wherein said data comprises at least data for enabling said at least one processor to use said plurality of auxiliary storage devices.

10. A program storage medium according to claim 9, wherein said data for enabling said at least one processor to use said plurality of auxiliary storage devices comprises a plurality of configuration defining parameters used in system generation processing executed by an operating system which controls said at least one processor.

11. A program storage medium according to claim 8, wherein said plurality of pieces of equipment comprise a plurality of processors each for constituting one of a plurality of servers and a plurality of auxiliary storage devices each used by either one of said plurality of servers;

wherein said data includes data which each processor needs to use at least one auxiliary storage device connected thereto.

12. A program storage medium according to claim 11, wherein said data which each processor needs comprises data each processor needs when said each processor activates at least one auxiliary storage device connected thereto.

13. A program storage medium according to claim 1, wherein said deciding step of installation locations includes the steps of:

displaying a drawing of a first installation area of said space on a first display area of a display screen of said display device;

displaying a first group of figures of a first group of user-specified pieces of equipment at user specified locations on said displayed drawing of said first installation area; and inspecting to determine whether or not one of said displayed first group of figures overlaps another of said displayed first group of figures.

14. A program storage medium according to claim 13, wherein each of said first group of figures of said pieces of equipment includes a space for opening and closing a maintenance door included in one of said pieces of equipment which said each figure represents;

wherein said inspecting step inspects whether one of said displayed first group of figures is spaced from another of said displayed first group of figures at least by amount required for opening of the maintenance door of each of said one displayed figure and said another displayed figure.

15. A program storage medium according to claim 13, wherein said deciding step of installation locations further includes sub-steps of:

moving one of said first group of displayed figures corresponding to a user-specified one of said first group of pieces of equipment to a user-specified location on said first installation area; and executing said inspecting unit with said moved figure.

16. A program storage medium according to claim 13, wherein said deciding step of installation locations further includes the steps of:

displaying a drawing of a second installation area of said space on a second display area of said display screen;

displaying a second group of figures of a user-specified second group of pieces of equipment on said second installation area;

moving one of said first group of figures corresponding to a user-specified one of said first group of pieces of equipment, to a user-specified location on said second installation area; and inspecting to determine whether or not said one moved displayed figure overlaps one of said displayed second group of figures.

17. A program storage medium according to claim 16, wherein said first and second display areas are manipulated by means of a multi-window function.

18. A program storage medium according to claim 13, wherein said deciding step of installation locations further includes a sub-step of displaying a relevant instruction on said display screen, when an overlap of one of said first group of figures on another thereof has been detected at said inspecting step.

19. A program storage medium according to claim 13, wherein said deciding step of installation locations further includes the sub-steps of:

creating a drawing of said first installation area in a first virtual-screen buffer;

creating said first group of figures of said first group of pieces of equipment in a second virtual screen buffer;

superimposing contents of said first and second virtual-screen buffers on each other in a real screen buffer; and displaying contents of said real-screen buffer on said display screen.

20. A program storage medium according to claim 1, wherein said program is programmed so as to further execute a step of creating an apparatus attribute values table including characteristics of said pieces of equipment, based upon data stored in an equipment library file and installation locations of said pieces of equipment decided by said deciding step of installation locations.

21. A program storage medium according to claim 20, wherein said apparatus attribute values table includes, for said pieces of equipment, names, amounts of dissipated heat, amounts of consumed electrical power, allowable lengths of a signal cable, allowable numbers of daisy-chained units and coordinate values of installation locations decided by said deciding step of installation locations.

22. A program storage medium according to claim 1, wherein said program is programmed so as to further execute a step of creating an environment attribute values table, after installation locations of said pieces of equipment have been decided;

wherein said environment attribute values table includes data on cooling capacity of cooling equipment predetermined for said installation area and power supply capacity of a power supply device predetermined for said installation area.

23. A program storage medium according to claim 1, wherein said program is programmed so as to further execute the steps of:

comparing a total amount of heat dissipated by said pieces of equipment to a cooling capacity predetermined for said installation area; and displaying a corresponding warning message in said display screen, if said total amount of said dissipated heat exceeds said cooling capacity for said installation area.

24. A program storage medium according to claim 23, wherein said comparing step is executed, by using data included in both said apparatus attribute values table created by said creating step of claim 20 and said environment attribute values table created by said creating step of claim 22.

25. A program storage medium according to claim 1, wherein said program is programmed so as to further execute the steps of:

comparing total amount of electrical power consumed by said pieces of equipment to power supply capacity predetermined for said installation area; and displaying a corresponding warning message in said display screen, if said total amount of consumed electrical power exceeds said power supply capacity.

26. A program storage medium according to claim 25, wherein said comparing step is executed, by using data included in both said apparatus attribute values table created by said creating step of claim 20 and said environment attribute values table created by said creating step of claim 22.

27. A program storage medium according to claim 1, wherein said data for aiding includes data representing instructions on signal-cables which connect said plurality of pieces of equipment with each other.

28. A program storage medium according to claim 1, wherein said deciding step of mutual connection includes a step of inspecting appropriateness of connection by cables between said pieces of equipment, in response to specifying of said connection by the user, after installation locations of said pieces of equipment have been decided.

29. A program storage medium according to claim 28, wherein said data for aiding includes data representing a layout drawing of said pieces of equipment together with signal cables connecting said plurality of pieces of equipment.

30. A program storage medium according to claim 28, wherein said data for aiding includes data representing instructions on signal-cables which connect said plurality of pieces of equipment with each other.

31. A program storage medium according to claim 1, wherein said deciding step of mutual connection includes the sub-steps of:

displaying connection of signal cables which connect figures of user-specified ones of said pieces of equipment displayed on said displayed drawing of said installation area; and inspecting appropriateness of said connection of said signal cables.

32. A program storage medium according to claim 31, wherein said data for aiding includes data representing a layout drawing of said pieces of equipment together with signal cables connecting said plurality of pieces of equipment.

33. A program storage medium according to claim 31, wherein said data for aiding includes data representing instructions on signal-cables which connect said plurality of pieces of equipment with each other.

34. A program storage medium according to claim 31, wherein said sub-step of inspecting appropriateness of said connection of signal cables includes inspecting a number of daisy-chains of each of said pieces of equipment required by the connection exceeds a maximum number of daisy-chains allowable for said each piece of equipment.

35. A program storage medium according to claim 31, wherein said sub-step of inspecting appropriateness of said connection of signal cables includes inspecting whether a sum of lengths of signal cables connected to each piece of equipment exceeds a maximum cable length allowable for said piece of equipment.

36. A program storage medium according to claim 31, wherein said inspecting step is executed, by using data included in said apparatus attribute values table created by said creating step of claim 20.

37. A program storage medium according to claim 31,
wherein said deciding step of mutual connection further includes a sub-step of creating equipment-characteristic tables each corresponding to one of pieces of equipment, after mutual connection of said pieces of equipment has been decided;
wherein one of said equipment-characteristic tables corresponding to one of said pieces of equipment including information for specifying another one of said pieces of equipment to which said corresponding one of said pieces of equipment is connected.

38. A program storage medium according to claim 31, wherein said deciding step of mutual connection further includes a sub-step of displaying connection of power-supply cables to a user-specified one of said pieces of equipment displayed on said displayed drawing of said installation area.

39. A program storage medium according to claim 38, wherein said data for aiding includes data representing a layout drawing of said pieces of equipment together with signal cables and power-supply cables connecting said plurality of pieces of equipment.

40. A program storage medium according to claim 38, wherein said data for aiding includes data representing instructions on power-supply cables which connect said plurality of pieces of equipment to a plurality of power-supply breakers.

41. A program storage medium according to claim 1, wherein said deciding step of mutual connection includes the sub-steps of:
displaying in said display screen, a drawing of said installation area and figures pieces of equipment with their installation locations already decided; and
displaying connection of power-supply cables to a user-specified one of said pieces of equipment displayed on said displayed drawing of said installation area.

42. A program storage medium according to claim 41, wherein said data for aiding includes data representing a layout drawing of said pieces of equipment together with signal cables and power-supply cables connecting said plurality of pieces of equipment.

43. A program storage medium according to claim 41, wherein said data for aiding includes data representing instructions on power-supply cables which connect said plurality of pieces of equipment to a plurality of power-supply breakers.

44. A program storage medium according to claim 41, wherein said sub-step of displaying power-supply connection includes the steps of:
selecting one of breakers provided in a distribution board that satisfies power-supply requirement set for said one user-specified piece of equipment; and
drawing a power-supply cable from said selected breaker to said user-specified piece of equipment.

45. A program storage medium according to claim 41, wherein said deciding step of mutual connection further includes the sub-steps of:
creating power-supply characteristic tables each for one of said power-supply cables, one of said tables for one of said power-supply cables including characteristic of a power-supply relevant to said one power-supply cable and the length of said one power-supply cable; and
storing in a file, said power-supply characteristic tables and information representing a drawing of an installation area including pieces of equipment connected to said power-supply cables.

46. A program storage medium according to claim 1, wherein said data for aiding includes data representing a work specification manual for use in carrying out installation work.

47. A program storage medium according to claim 46, wherein said work specification manual includes a layout drawing of said pieces of equipment together with signal cables and power-supply cables connecting said plurality of equipment, instructions on signal-cables to connect said plurality of pieces of equipment with each other and instructions on power-supply cables to connect said plurality of pieces of equipment to a plurality of power-supply breakers.

48. A method of aiding arrangement of a plurality of pieces of equipment into a space for a computer center, by using a computer, wherein each of the plurality of pieces of equipment comprises a processor or an auxiliary storage device, comprising the steps of:
deciding appropriate installation locations of said plurality of pieces of equipment through an interactive operation with a user, by using a drawing of said space displayed on a display device connected to said computer;
deciding mutual connection between said plurality of pieces of equipment, based on an instruction by the user, after said installation locations of said plurality of pieces of equipment have been decided; and
generating data for aiding work to install said plurality of pieces of equipment at said computer center, based on said installation locations and said mutual connection decided for said plurality of pieces of equipment.

49. A method according to claim 48, wherein said data comprises at least data representing a connection-completed equipment layout drawing which shows arrangement and connection of said plurality of pieces of equipment.

50. A method according to claim 48,
wherein said plurality of pieces of equipment comprise at least one processor which uses a plurality of channels and a plurality of auxiliary storage devices which said at least one processor uses;
wherein said step of deciding the connection includes a step of deciding connection of said plurality of channels and said plurality of auxiliary storage devices.

51. A method according to claim 48,
wherein said plurality of pieces of equipment comprise a plurality of processors each for constituting one of a plurality of servers and a plurality of auxiliary storage devices each used by either one of said plurality of servers;
wherein said step of deciding the connection includes a step of deciding connection of said plurality of processors and said plurality of auxiliary storage devices.

52. A method of aiding arrangement of a plurality of pieces of equipment into a space for a computer center, by using a computer, wherein each of the plurality of pieces of equipment comprises a processor or an auxiliary storage device, comprising the steps of:
deciding mutual connection between said plurality of pieces of equipment through an interactive operation with a user, by using a plurality of figures displayed on a display device connected to said computer; and generating data representing a logical configuration drawing which shows mutual logical connection of said plurality of pieces of equipment, based on said mutual connection decided for said plurality of pieces of equipment and characteristics thereof.

53. A method according to claim 52, wherein said plurality of pieces of equipment comprise at least one processor which uses a plurality of channels, and a plurality of auxiliary storage devices used by said at least one processor;

wherein said step of deciding the connection includes a step of deciding connection of said plurality of channels and said plurality of auxiliary storage devices;

wherein said data representing said logical configuration drawing comprises data which shows logical connection of said plurality of channels and said plurality of auxiliary storage devices.

54. A method according to claim 52, wherein said plurality of pieces of equipment comprise a plurality of processors each for constituting one of a plurality of servers and a plurality of auxiliary storage devices each used by either one of said plurality of servers;

wherein said step of deciding the connection includes a step of deciding connection of said plurality of processors and said plurality of auxiliary storage devices;

wherein said data representing said logical configuration drawing comprises data which shows logical connection of said plurality of processors and said plurality of auxiliary storage devices.

55. A method of aiding arrangement of a plurality of pieces of equipment into a space for a computer center, by using a computer, wherein each of the plurality of pieces of equipment comprises a processor or an auxiliary storage device, comprising the steps of:

deciding appropriate installation locations of said plurality of pieces of equipment through an interactive operation with a user, by using a drawing of said space displayed on a display device connected to said computer:

deciding mutual connection between said plurality of pieces of equipment, based on an instruction by the user, after said installation locations of said plurality of pieces of equipment have been decided; and generating data for operating said plurality of pieces of equipment, based on said mutual connection decided for said plurality of pieces of equipment and characteristics thereof.

56. A method according to claim 55, wherein said plurality of pieces of equipment comprise at least one processor which uses a plurality of channels and a plurality of auxiliary storage devices which said at least one processor uses;

wherein said data comprises at least data for enabling said at least one processor to use said plurality of auxiliary storage devices.

57. A method according to claim 56, wherein said data for enabling said at least one processor to use said plurality of auxiliary storage devices comprises a plurality of configuration defining parameters used in system generation processing executed by an operating system which controls said at least one processor.

58. A method according to claim 55, wherein said plurality of pieces of equipment comprise a plurality of processors each for constituting one of a plurality of servers and a plurality of auxiliary storage devices each used by either one of said plurality of servers;

wherein said data includes data which each processor needs to use at least one auxiliary storage device connected thereto.

59. A method according to claim 58, wherein said data which each processor needs comprises data each processor needs when said each processor activates at least one auxiliary storage device connected thereto.

* * * * *